United States Patent
Matsuzaki et al.

(10) Patent No.: US 7,782,682 B2
(45) Date of Patent: Aug. 24, 2010

(54) SEMICONDUCTOR DEVICE WITH CIRCUITRY FOR EFFICIENT INFORMATION EXCHANGE

(75) Inventors: Yasurou Matsuzaki, Kawasaki (JP); Masao Taguchi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 2752 days.

(21) Appl. No.: 10/006,238

(22) Filed: Dec. 10, 2001

(65) Prior Publication Data
US 2002/0125499 A1 Sep. 12, 2002

(30) Foreign Application Priority Data
Mar. 9, 2001 (JP) ............... 2001-067616

(51) Int. Cl.
G11C 7/77 (2006.01)
(52) U.S. Cl. .............. 365/189.17; 365/83; 365/189.16; 365/189.05; 365/189.12; 365/219; 365/221; 365/233.14; 365/233.16; 365/240
(58) Field of Classification Search ............ 365/189.17, 365/83, 189.16, 189.05, 189.12, 219, 221, 365/233.14, 233.16, 240
See application file for complete search history.

(56) References Cited

U.S. PATENT DOCUMENTS

| | | | | |
|---|---|---|---|---|
| 5,396,464 A | * | 3/1995 | Slemmer | ............ 365/201 |
| 5,594,762 A | | 1/1997 | Joo et al. | ............ 375/371 |
| 5,905,690 A | | 5/1999 | Sakurai et al. | ............ 365/233 |
| 5,930,197 A | | 7/1999 | Ishibashi et al. | ............ 365/233 |
| 2001/0055022 A1 | * | 12/2001 | Yoshioka | ............ 345/567 |

FOREIGN PATENT DOCUMENTS

| | | |
|---|---|---|
| EP | 0 373 492 | 6/1990 |
| EP | 0 961 223 | 12/1999 |
| JP | 7-307944 | 11/1995 |

OTHER PUBLICATIONS

European Patent Office Communication including European Search Report for corresponding European Patent Application 01310305 dated Mar. 9, 2004.
Office Action dated Feb. 24, 2010 issued in the corresponding European patent application No. 01 310 305.6.
Benini et al.; "Synthesis of Low-Overhead Interfaces for Power-Efficient Communication over Wide Buses"; Design automation Conference, 1999 Proceedings, IEEE, Jun. 1999, pp. 128-133.
Khara et al.; "High-Level Synthesis with SDRAMs and RAMBUS DRAMs"; *IEICE Trans. Fundamentals*; vol. E82-A, No. 11; Nov. 1999; pp. 2347-2355.
European Patent Office Communication including Partial European Search Report for corresponding European Patent Application No. 01310305 dated Dec. 16, 2003.

* cited by examiner

*Primary Examiner*—Hoai V Ho
*Assistant Examiner*—Fernando N Hidalgo
(74) *Attorney, Agent, or Firm*—Kratz, Quintos & Hanson, LLP

(57) ABSTRACT

A semiconductor device having a register and an information generation circuit can reduce data to be transferred, and consequently save electric power. The register stores first information. The information generation circuit generates, in response to a signal acquired from the an exterior of the device, second information indicating which bits of the first information is to be inverted.

22 Claims, 27 Drawing Sheets

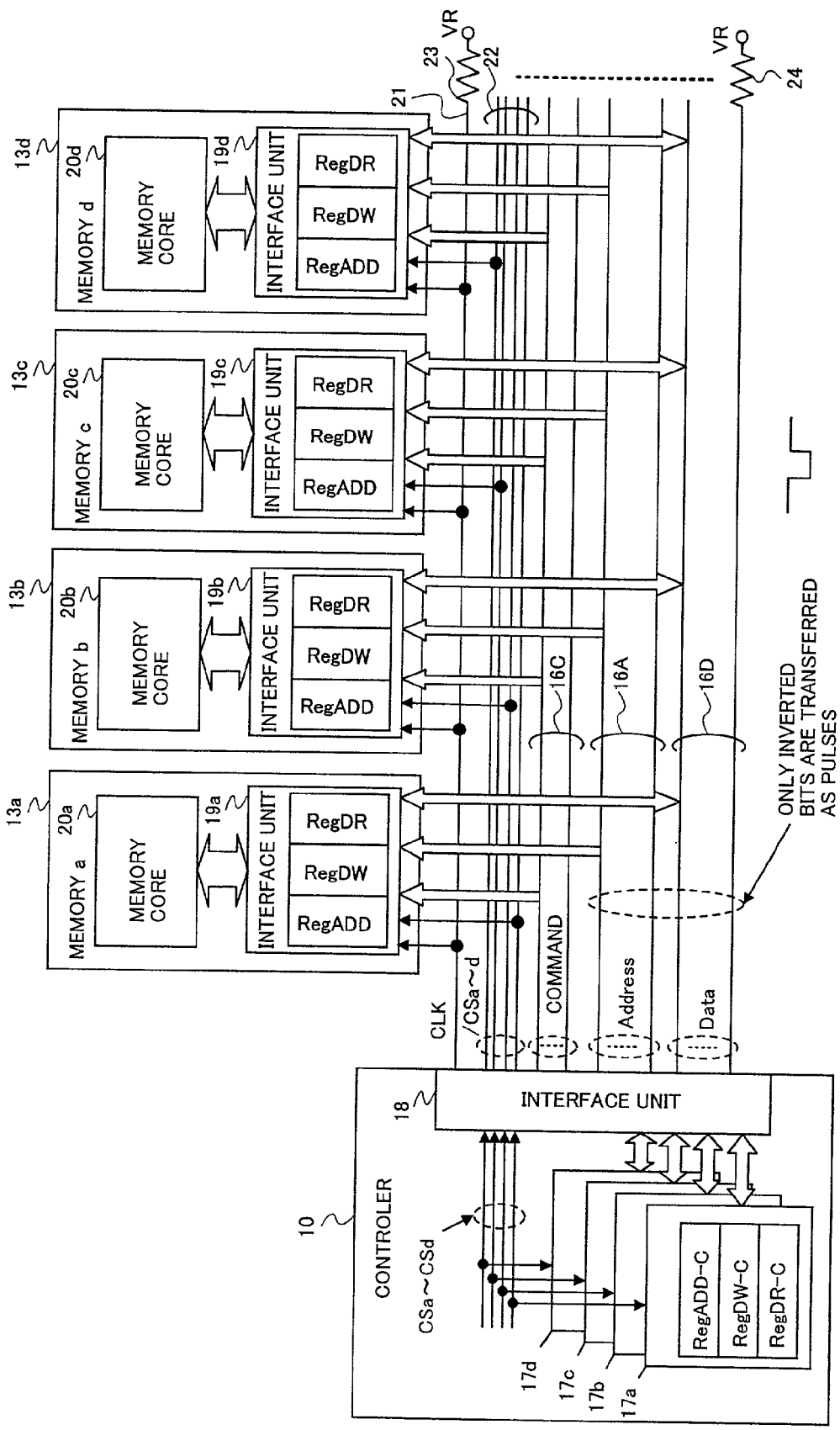

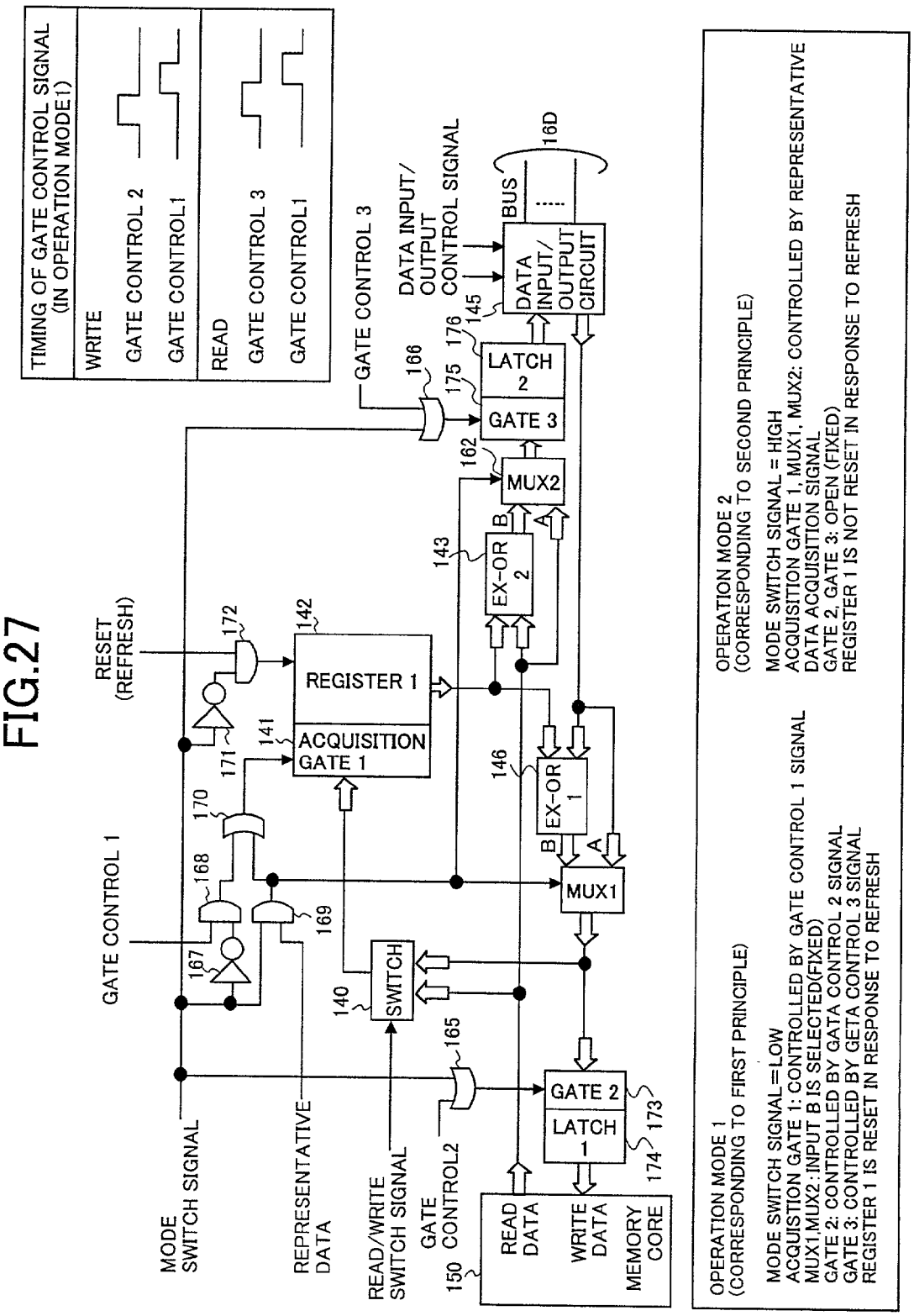

SEMICONDUCTOR DEVICE WITH CIRCUITRY FOR EFFICIENT INFORMATION EXCHANGE

BACKGROUND OF THE INVENTION

1. Field of the Invention

The present invention generally relates to semiconductor devices, and more particularly, to interface method of semiconductor devices.

2. Description of the Related Art

It is necessary, in some cases, to transfer data between semiconductor devices. The following case of transferring two sets of 16 bit width data, D1 and D2, sequentially from a semiconductor device A to another semiconductor device B, will be considered as an example.

D1: 1100110011001100

D2: 1100110011001101

In this case, only the last bit is different from each other, and the other bits are the same. Generally, in case of sequential data of moving pictures for example, data is almost the same as the next data, and only a part of data is different. Thus, uncompressed data is redundant and transferring uncompressed data is not efficient. Data is usually compressed, then transferred or stored into recording medium.

In some situations, however, it is necessary to transfer uncompressed data between semiconductor devices. When image data is processed, for example, uncompressed data or decompressed data may be transferred between semiconductor devices.

When raw data is transferred without data compression, however, data contains much unnecessary information, and unnecessary electric power is consumed.

SUMMARY OF THE INVENTION

Accordingly, it is a general object of the present invention to provide a novel and useful semiconductor device in which one or more of the problems described above are eliminated.

Another and more specific object of the present invention is to provide a semiconductor device which enables efficient data transfer and reduces unnecessary electric power consumption, and to provide a method for making the same.

In order to achieve the above objects according to the present invention, a semiconductor device, exchanging a data series with an exterior of the device, includes a register which stores a first data item of said data series, the first data item immediately preceding a second data item of said data series, and an exchange circuit which exchanges with the exterior of the device a signal indicative of which bit or bits of the first data item are to be inverted to convert the first data item into the second data item, the exchanging of the signal effectively achieving the exchanging of the data series.

The signal indicates which bit or bits of the first data item are to be inverted to convert the first data item into the second data item. By exchanging the signal, the second data item can be exchanged between a semiconductor device and another semiconductor device. The signal is less redundant than the second data item, and the exchanging the signal consumes less electric power than the exchanging the second information as it is.

Other objects, features, and advantages of the present invention will be more apparent from the following detailed description when read in conjunction with the accompanying drawings.

BRIEF DESCRIPTION OF THE DRAWINGS

FIG. 2 is a block diagram showing an embodiment of the present invention;

FIG. 27 is a block diagram of an embodiment of a data input/output unit of a memory corresponding to both the first and second principle of the present invention.

DETAIL DESCRIPTION OF THE PREFERRED EMBODIMENTS

A description of the first principle of the present invention will now be given, with reference to FIG. 1A.

Figure 1A:
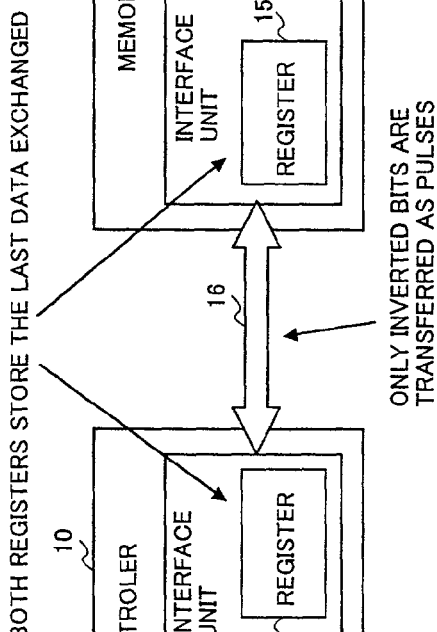
FIG. 1A is a block diagram showing the first principle of the present invention.

FIG. 1A shows the system of two semiconductor devices 10 and 13, connected through a data bus 16. In this example, the semiconductor device 10 is a controller, and the semiconductor device 13 is a semiconductor memory device (a single memory chip, hereinafter referred to as "memory") controlled by the controller 10.

The controller 10 is equipped with an interface unit 11 including a register 12. Similarly, the memory 13 is equipped with an interface unit 14 including a register 15.

Using the example of data transfer previously described, the first principle of the present invention will be explained. In the related art, when two data, D1: 1100110011001100 and D2: 1100110011001101, are to be transferred from the controller 10 to the memory 13, D1 and D2 are transferred as they are, i.e., without any data manipulation. In the first principle of the present invention, on the other hand, D1 is transferred first, but, when D2 is transferred, only the bit which is different, or inverted, between D1 and D2 is transferred. In other words, D2': 0000000000000001, instead of D2, is transferred. The memory 13 reproduces the data D2, using the data D2' and the data D1 which was transferred just before D2'. Data is similarly transferred from the memory 13 to the controller 10.

In other words, both the controller 10 and the memory 13 store the last data exchanged in registers 12 and 15, respectively. The transferring device transfers only bits which are different between the stored data and data to be transferred next. The receiving device reproduces the original data using the data received and the data stored. A pulse signal is transferred to inform the receiving device which bit is inverted. Hereinafter such pulse signal may be referred to as a "data inversion pulse signal".

Figure 1B:
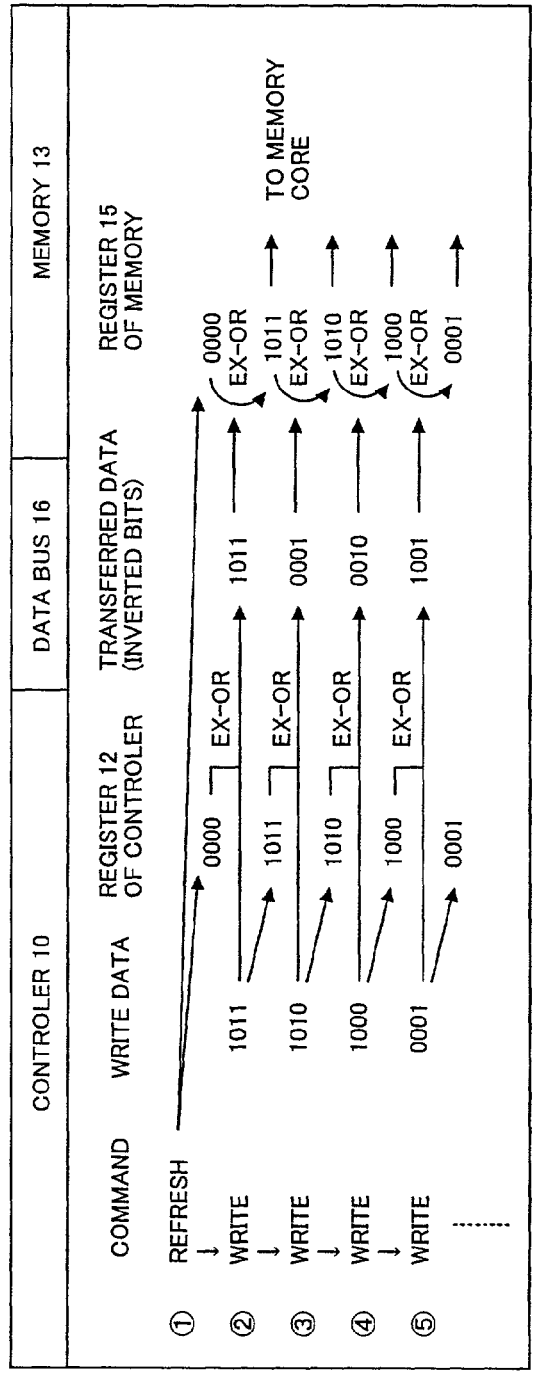
FIG. 1B is a diagram illustrating how an example data series are exchanged.

With reference to a diagram shown in FIG. 1B, this process is described in detail. The sequence describes the case that the controller 10 writes data into the memory 13.

Step 1: the controller 10 issues a refresh command by which both registers 12 and 15 of the controller 10 and the memory 13 respectively are reset to a value 0000, for example. The reset value is not necessarily limited to 0000, and it can be any value other than 0000 as long as both registers 12 and 15 are reset to the same value.

Step 2: in this step, the controller 10 writes data 1011 into the memory 13. The controller 10 calculates an Exclusive-Or value of data 1011 to be transferred and data 0000 stored in the register 12, and sends the result to the memory 13 through the data bus 16. The memory 13 receives the result data 1011, and inverts the bits of the register 15 that correspond in position to "1"s of the received data 1011 to produce the data 1011. In this example, because both registers 12 and 15 contain 0000, the data transferred and the data reproduced are the same. The controller 10 and the memory 13 overwrite the registers 12 and 15 with 1011, respectively. The reproduced data 1011 is transferred to the memory core in the memory 13, and stored therein.

Step 3: The controller 10 writes data 1010 into the memory 13 in this step. Then, the controller 10 calculates an Exclusive-Or value of the data 1010 and the data 1011 which is stored in the register 12, and transfer the result 0001 to the memory 13. After receiving the result 0001, the memory 13 inverts the bits of the register 15 at positions corresponding to "1"s of the received data to reproduce the data 1010. The controller 10 and the memory 13 update the registers 12 and 15 by storing 1010 therein.

Similar processes are repeated in step 4 and step 5.

Because the last data communicated to each other is stored in the registers 12 and 15 of the controller 10 and the memory 13, respectively, and only the differential bits between the data to be transferred and the data stored is transferred, and because the receiving device reproduces the actual data using the stored data and the transferred data, the frequency of transferring data "1" is greatly reduced, and the reduction consequently reduces electric power consumption of both the transferring device and the receiving device. In step 3 mentioned above, data 0001, instead of data 1010, is transferred, so that the data transfer process consumes less electric power by the power required to send a "1". This method is especially effective for transferring motion picture data where successive data is almost identical except for a small portion thereof.

FIG. 1B shows a sequence performed when the controller 10 writes data into the memory 13. A sequence that is performed when the memory 13 transfers data to the controller 10 is the same.

In summary, the controller 10 and the memory 13 are semiconductor devices which include a register (12, 15) to store the first information (the first data just after refresh or the last data exchanged). The controller 10 and the memory 13 also include an information generation circuit, which is an internal circuit of the controller 10 and the memory 13, to be provided in the interface block, for example, which generates the second information using the signal. The signal is the result of an Exclusive-Or calculation, and is transferred through the data bus 16. The signal is a signal to specify which bits of the first information are to be inverted. In other words, the signal is a result of an Exclusive-Or operation. The information generation circuit generates, by executing an Exclusive-Or operation, for example, the second information using both the first information and the signal.

The present invention includes a method of information processing comprising two steps. In the first step, the first information, which is the first data immediately after refresh or the last data communicated to each other, is stored to the register (12 or 15). In the second step, the second information is generated using the signal, which is the result of an Exclusive-Or operation to be transferred through the data bus 16, and the first information. The second information is sent to a specific circuit in the second step. The signal informs which bits of the first information are to be inverted.

Further, the controller 10 and the memory 13 are semiconductor devices including the registers (12, 15) and the information reproduction circuit. The registers (12, 15) store the first information which is either the first data immediately after reset or the last data exchanged. An information reproduction circuit receives second information such as, for example, data to be written by the controller 10, and sends a signal to an external unit such as, for example, the memory 13 in the case of FIG. 1A. The information reproduction circuit is an internal circuit of the controller 10 and the memory 13, and it may be included in the interface unit 10 and 13, respectively. The signal is obtained by a logical operation such as, for example, Exclusive-Or, based on the first information stored in the registers and the second information received by the information reproduction circuit.

Furthermore, the present invention includes a method of information processing. This method includes a step of storing the first information in the registers (12, 15), and a step of reproducing the signal by a logical operation such as, for example, Exclusive-Or, using the second information and the first information, followed by sending the signal to the exterior of the device. The first information is either the first data immediately after a refresh, or the last data exchanged. The first information is the signal that informs the external unit which bit is inverted.

In the explanation described above, a "refresh" command is supposed to be issued from time to time to reset the registers 12 and 15. In the case that the memory 13 is a DRAM which requires periodic refresh operations, however, the controller 10 needs to issue a "refresh" command to the DRAM periodically. This "refresh" command can also be used to reset the registers 12 and 15 periodically. Even if the data stored in either the registers 12 or 15, or both, changes by accident and becomes different from each other, the periodic "refresh" process minimizes the occurrence of errors because the data of both registers are equalized by a periodic "refresh" command.

A "refresh" command may not be necessary to reset the registers 12 and 15. For example, a Power-on Reset Signal, which is internally generated when the power of the semiconductor devices such as the controller 10 and the memory 13, for example, is turned on, can be used to reset the registers instead of a "refresh" command. A signal to control stand-by mode of semiconductor devices, such as the clock enable signal, or CKE for short, of Synchronous DRAM is also useful to reset the registers.

Moreover, like data signals, address signals can be transferred using the first principle of the present invention. This embodiment will be discussed later.

Preferred embodiments and examples will be described below. Terms "Read Data" and "Write Data" are used because data is assumed, for example, to be transferred between a controller and a memory. For both memories and controllers, these terms have the following meanings.

Write Data: Data to be transferred from a controller to a memory

Read Data: Data to be transferred from a memory to a controller

In other words, Write Data is data that a controller sends and a memory receives.

First Embodiment

FIG. 2 is the block diagram showing an embodiment of the present invention. In the system show in the diagram, the controller controls 4 memories 13a, 13b, 13c, and 13d. The first principle of the present invention previously described is applied to the transfer of address, Write Data, and Read Data between the controller 10 and the 4 memories 13a, 13b, 13c, and 13d.

The controller 10 and the 4 memories 13a, 13b, 13c, and 13d are connected each other through a data bus 16D, an address bus 16A, a command bus 16C, a clock line 21, and a chip selection signal line 22. The data bus 16D is connected to a predetermined electric voltage VR through resistors 24. Similarly, the clock signal line 21 is connected to the electric voltage VR. The voltage VR corresponds to "0", or a high level, of a logic circuit. Through the address bus 16A and the data bus 16D, a low-level data inversion pulse signal is sent when data "1" is transferred. Immediately after a refresh, raw Write Data is sent through the data bus 16D.

The controller 10 has registers 17a, 17b, 17c, and 17d which correspond to memories 13a, 13b, 13c, and 13d, and an interface unit 18. Each register 17a, 17b, 17c, and 17d is equivalent to the register 12 of FIG. 1A. The memories 13a, 13b, 13c, and 13d have memory cores 20a, 20b, 20c, and 20d and interface units 19a, 19b, 19c, and 19d, respectively. The internal registers of each interface unit 19a-19d is equivalent to the register 15 of FIG. 1A. The interface unit 18 of the controller 10 and the interface units 19a-19d are connected to the data bus 16D, the address bus 16A, the command line 16C, the clock line 21, and the chip select signal line 22, respectively.

The registers 17a-17d have a register RegADD-C for address, a register RegDW-C for the write data, and a register RegDR-C for the read data. The register RegADD-C for the address stores a reset address value or the last address value exchanged. The register RegDR-C for read data stores a reset read data value or the last read data exchanged. The interface 18 is an interface which can be switched to provide a connection with a selected one of multiple semiconductor devices such as the memories 13a-13d in FIG. 2. The interface 18, as described with reference to FIG. 1A, has two functions. First, it calculates data or an address by executing Exclusive-Or operation based on the register value and the data to be sent, followed by transmission thereof to a corresponding bus. Secondly, it receives data from a corresponding bus, and reproduces original data by executing Exclusive-Or operation using the register value and the data received through the corresponding bus. The configurations of the interface 18 will be discussed in more detail later.

The interface units 19a-19d of the memories 13a-13d have the address register RegADD, Write Data register RegDW, and Read Data register RegDR, respectively. The address register RegADD of the interface units 19a-19d corresponds to the address register RegADD-C of the respective registers 17a-17d of the controller 10, and stores a reset address value or the last address value exchanged. The Write Data register RegDW of the interface units 19a-19d corresponds to the Write Data register RegDW-C of the respective registers 17a-17d of the controller 10, and stores reset write data or the last Write Data exchanged. The Read Data register RegDR corresponds to the Write Data register RegDR-C of the registers 17a-17d of the controller 10, and stores a reset Read Data or the last Read Data exchanged. The interfaces 19a-19d, as previously described with reference to FIG. 1A, have two functions. First, they calculate data or an address by an Exclusive-Or operation based on the register value and the data to be sent, and send the calculated data or address to a corresponding bus. Secondly, they reproduce data by calculating an Exclusive-Or of the register value and receiving data obtained from a corresponding bus. The detail of these configurations is to be described later. Memory cores 20a-20d include a matrix array of many memory cells.

The operation of the configuration shown in FIG. 2 will be described next.

The controller 10 issues a refresh command to the memories 13a-13d, to reset the registers RegADD-C, RegDW-C, and RegDR-C of the registers 17a-17d of the controller 10, and the registers RegADD, RegDW, and RegDR of the interface units 19a-19d of the memories 13a-13d, respectively. This step is equivalent to the step 1 of FIG. 1B. Each register is reset to "0", for example.

In the next step, the controller 10 turns on a Chip Select Signal CSa-CSd which corresponds to a memory selected, and issues a command. For example, when the Chip Select Signal CSa is ON, the register 17a of the controller 10 is automatically activated, and the memory 13a is selected through the signal line 22. If a write command is issued, the interface unit 18 of the controller 10 calculates an Exclusive-Or of the address and/or data to be sent and the data stored in the registers RegADD-C, RegDW-C, and/or RegDR-C. Then, the interface unit 18 stores the calculated value in these registers, and sends it through the address bus 16A and the data bus 16D. This step is equivalent to the step 2 of FIG. 1B. The selected memory 13a receives Exclusive-Or results through both the address bus 16A and the data bus 16D, and calculates the Exclusive-Or of the received data and the data contained in the registers RegADD, RegDW, and RegDR. The selected memory 13a also writes the results into the registers, and at the same time, sends the results to the memory core 20a. This step is equivalent to the step 2 of FIG. 1B. Thereafter the same operation as described above will be repeated.

When a read command is issued the interface unit 19a of the memory 13a calculates the Exclusive-Or of the address and/or data to be sent and the data contained in the registers RegADD, RegDW, and RegDR. The interface unit 19a writes the result of the operation into the registers, and sends the result through the address bus 16A and the data bus 16D. The controller 10 receives the result of the Exclusive-Or through the address bus 16A and the data bus 16D, and calculates the Exclusive-Or of the received data and the data contained in the registers RegADD-C, RegDW-C, and RegDR-C. The controller 10 writes the result of the Exclusive-Or to the registers, and at the same time, sends the data to the internal circuit.

As described above, the interface units 18 and 19a-19d of the controller 10 and the memory 13a-13d send the result of Exclusive-Or operation that contains "1" at bit positions where current data differs from the preceding data. Therefore, the frequency of transferring "1"s, which are low level pulses, through the address bus 16A and/or the data bus 16D is reduced, and consequently the electric power consumption is reduced.

First Embodiment of Data Input Unit of Memory

The first embodiment of the data input unit provided in the interface units 19a-19d of the memories 13a-13d will be described next. The first embodiment is a data input unit which inputs external data in synchronism with a clock signal.

Figure 3:
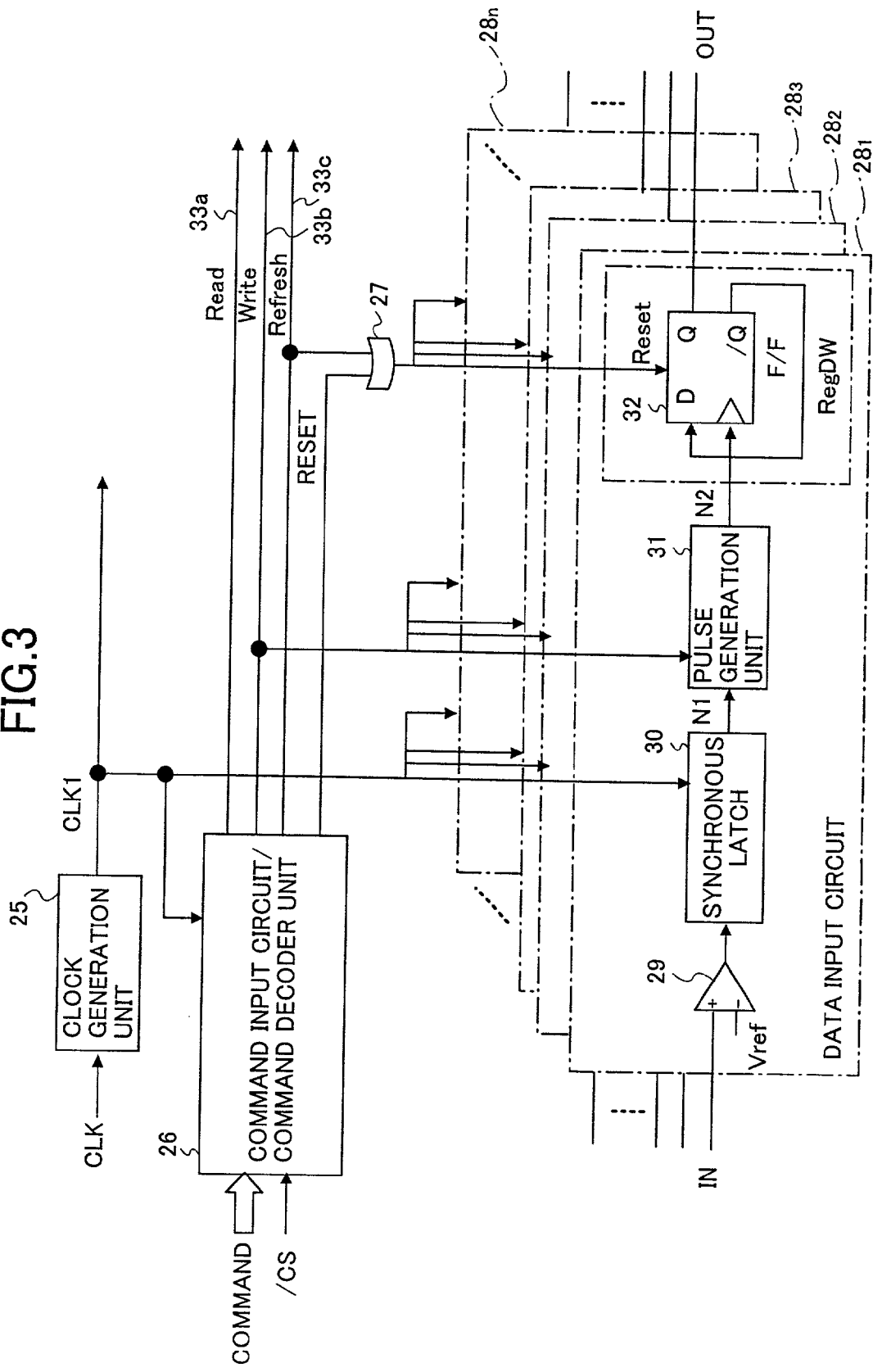
FIG. 3 is a block diagram showing the first embodiment of the data input circuit provided in the memory.

Each interface unit 19a-19d has a data input unit which receives data (Write Data) from the data bus 16D. FIG. 3 shows the first embodiment of the data input unit. The data input unit includes a clock generating unit 25, a command input and decode unit 26, an OR gate 27, and "n" data input units $28_1$-$28_n$ where "n" is a natural number. The clock generating unit 25 receives a clock signal from a clock line 21, generates an internal clock CLK1, and sends it to the command input circuit/command decode unit 26 and the data input units $28_1$-$28_n$. The command input circuit/command decode unit 26 is turned ON (Enable mode) when the unit receives a chip select signal CS (any one of CSa-CSd), receives a command through the command bus 16C, and decodes it. The command input circuit/command decode unit 26 drives one of three control lines 33a-33c in accordance with the result of the decoding. In the case of a read command, the command input circuit/command decode unit 26 turns on the control line 33a, and issue an internal read command. In the case of a read command, however, the command input circuit/command decode unit 26 turns on the control line 33b and issues an internal write command. When it receives a refresh command, it turns on the control line 33c, and issue an internal refresh command.

Figure 4:
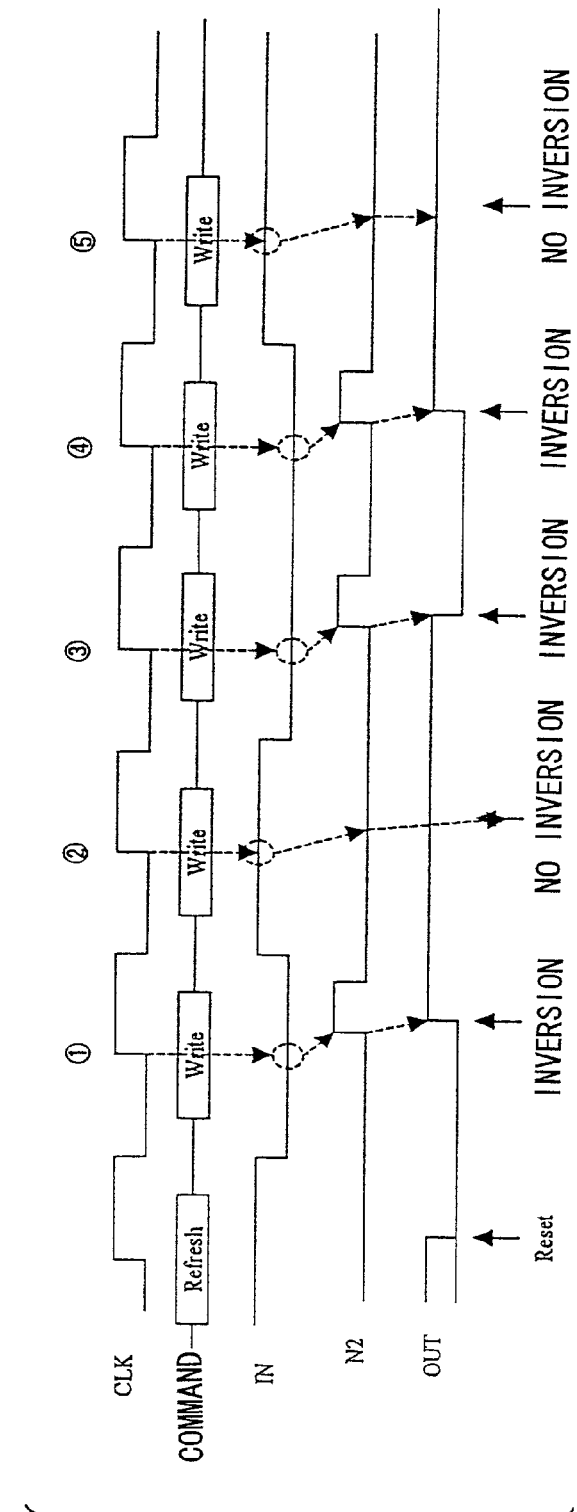
FIG. 4 is a timing chart showing the circuit operation described in FIG. 3.

Each data input unit $28_1$-$28_n$ includes a comparator 29, a synchronous latch 30, a pulse generator 31, and a register RegDW. The register RegDW includes a flip-flop (F/F) 32. Each data input units $28_1$-$28_n$ is connected to a corresponding line of the data bus 16D. If the data bus 16D is 16-bit wide, for example, 16 data input units $28_1$-$28_{16}$ are to be provided. The comparator 29 compares the corresponding 1-bit data with the threshold voltage Vref, and checks the logical value, "1" or "0", of the input data IN. The synchronous latch 30 latches the output of the comparator 29 in response to the internal clock. The pulse generator 31 generates, when the control line 33b is ON, in other words, when the generator receives a write command, a pulse N2 in response to the output signal N1 from the synchronous latch 30. The pulse N2 is input into the clock input of the flip-flop 32. The "/Q" output of the flip-flop 32 is input to a "D" input, and the "Q" output is output as the output signal of the data input unit $28_1$. The flip-flop 32 is to be reset according to the output of the OR gate 27. The OR gate 27 is reset when it receives either a reset signal of the command input circuit/command decode unit 26, which is generated when the chip select signal CS is turned off, or a refresh command, in other words, when the control line 33c is turned ON. When the OR gate is reset, the "Q" output becomes FIG. 4 shows the timing chart of the circuit described in FIG. 3, in case that a write data IN is input to the data input unit $28_1$. A command is input in synchronism with the clock CLK. In this example, a refresh command is input first, and the flip-flop 32 is reset. Then, a write data IN and a write command are input together as indicated as ① in FIG. 4. The write data IN passes through the comparator 29, and is latched by the synchronous latch 30. The synchronous latch 30 latches the data IN in synchronism with the falling edge of the clock CLK, or more precisely, the internal clock CLK1 generated using CLK. The latched output turns to N1, and is sent to the pulse generator 31. The signal N1 is not illustrated in the timing chart shown in FIG. 4.

The command input circuit/command decode unit 26 decodes this write command, and drives the control line 33b. Receiving the control signal through the control line 33b, the pulse generator 31 is turned to the enable mode, and generates the pulse N2 in response to the data IN1 as indicated by ① in FIG. 4. In other words, the write data "1" is latched in synchronism with the clock, and a single prescribed pulse signal is generated. The pulse N2 inverts the state of the flip-flop 32, and the "Q" output turns from a low level to a high level. In other words, the first data "1" sent out immediately after a refresh is output, as the OUT signal, to an internal circuit such as the memory core 20a shown in FIG. 2, but not shown in FIG. 3, and stored in the flip-flop 32 at the same time.

At the timing indicated as ②, both a write command and data IN, which is "0", or a pulse of the high level, in this example, are input. The fact that the data IN is "0" indicates that the result of an Exclusive-Or calculation at the sending side is "0", or in other words, the write data is the same as the previous data. The synchronous latch 30 latches a high level signal, and output an N1 signal to the pulse generator 31. The pulse generator 31 does not respond to the high level signal N1, and consequently does not generate a pulse N2. The state of the flip-flop is not inverted, and the output "OUT" remains at the same high level.

Both a write command and data "1", which is a low level pulse, are input at the timing indicated as ③. It should be noted that the data to be sent at ③ is an inversion of ②. In this case, the flip-flop 32 receives a pulse N2, and inverts its state as it does at the timing ①. The output OUT goes down to a low level consequently.

The circuit works in a similar manner at the timing indicated as ④ and ⑤. The data transferred throughout the process of timings ①-⑤ is 10110. The original data, on the other hand, is 11011. The output OUT from the data input unit $28_1$ is also 11011, and it is obvious that the original data is reproduced after the data transfer. It should also be noted that, because the result of Exclusive-Or, 10110, is transferred instead of the original data 11011 as it is, the electric power to be consumed for transferring excessive "1" is saved.

At each timings ①-⑤, "n"-bit parallel data are transferred through the data bus 16D. Accordingly, the data input circuits $28_2$-$28_n$ operates in the same manner as the data input circuit 281.

Embodiment of Address Input Unit in Memory

Figure 5:
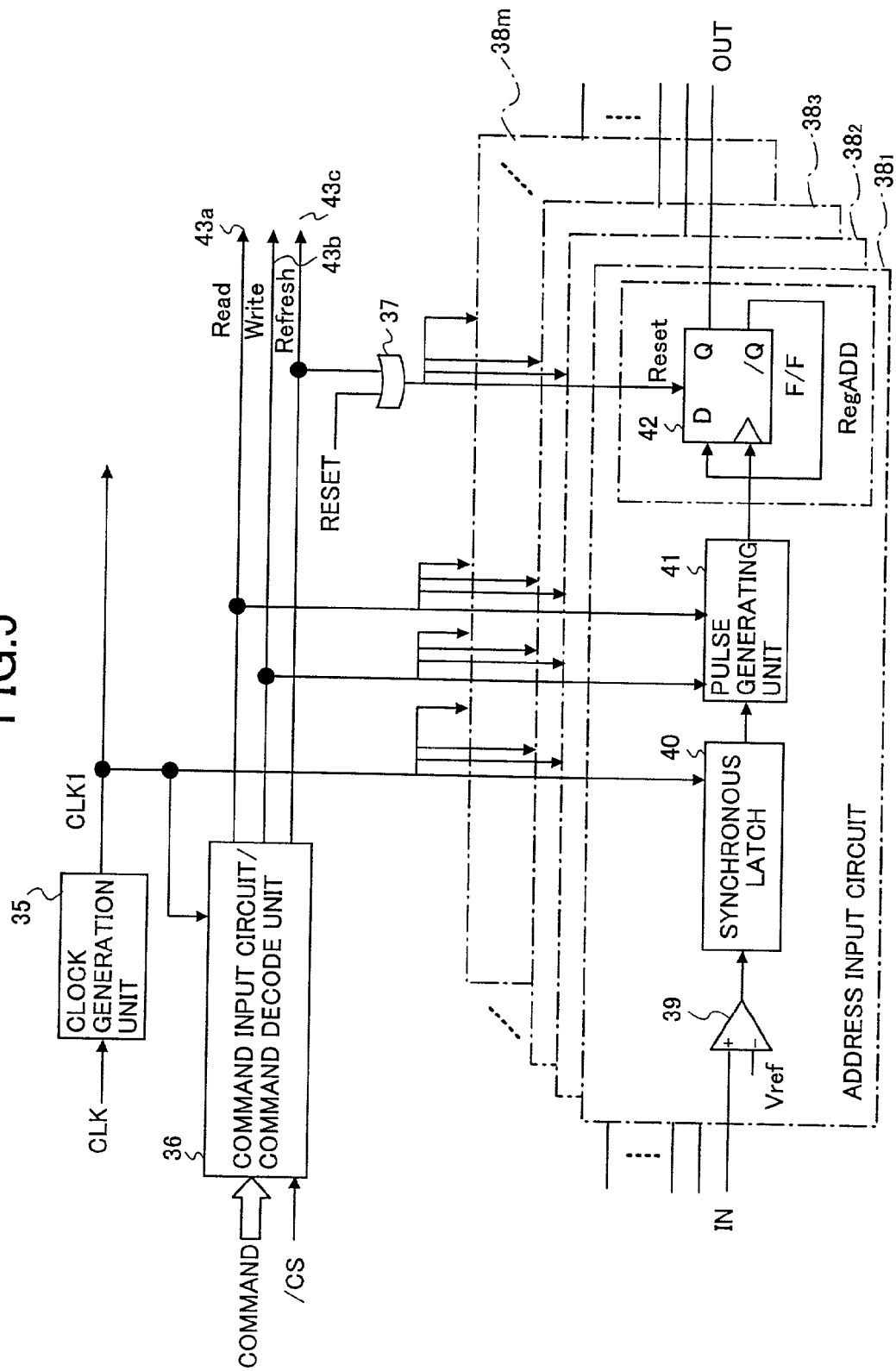
FIG. 5 is a block diagram showing the address input circuit provided in the memory.

FIG. 5 shows an embodiment of the address input unit provided in the interface units 19a-19d of the memories 13a-13d.

The interface units 19a-19d include address input units which receive addresses from the address bus 16A. The address input unit is equivalent to the data input unit of the first embodiment. The address input unit, like the data input unit, includes a clock generating unit 35, a command input circuit/command decode unit 36, an OR gate 37, and "m" address input units $38_1$-$38_m$, where m is the number of bits constituting addresses. Each address unit $38_1$-$38_m$ includes a comparator 39 to receive an address N, a synchronous latch 40, a pulse generator 41, and a register RegADD. The register RegADD includes a flip-flop 42.

The difference between the address input unit and the data input unit is that the pulse generator 41 is controlled through both a control line 43a, which turns ON when a read command is received, and a control line 43b, which turns ON when a write command is received. The address input unit is controlled by both control lines 43a and 43b because the address input units $38_1$-$38_m$ need to be controlled when they receive whichever a read command or a write command.

The address input unit described in FIG. 5 operates in the same manner as the data input unit whose timing chart is described in FIG. 4, and a further description of this operation will not be given here.

Second Embodiment of Data Input Unit of Memories

The second embodiment of the data input unit provided in the interface units 19a-19d of the memories 13a-13d will be described below.

Figure 6:
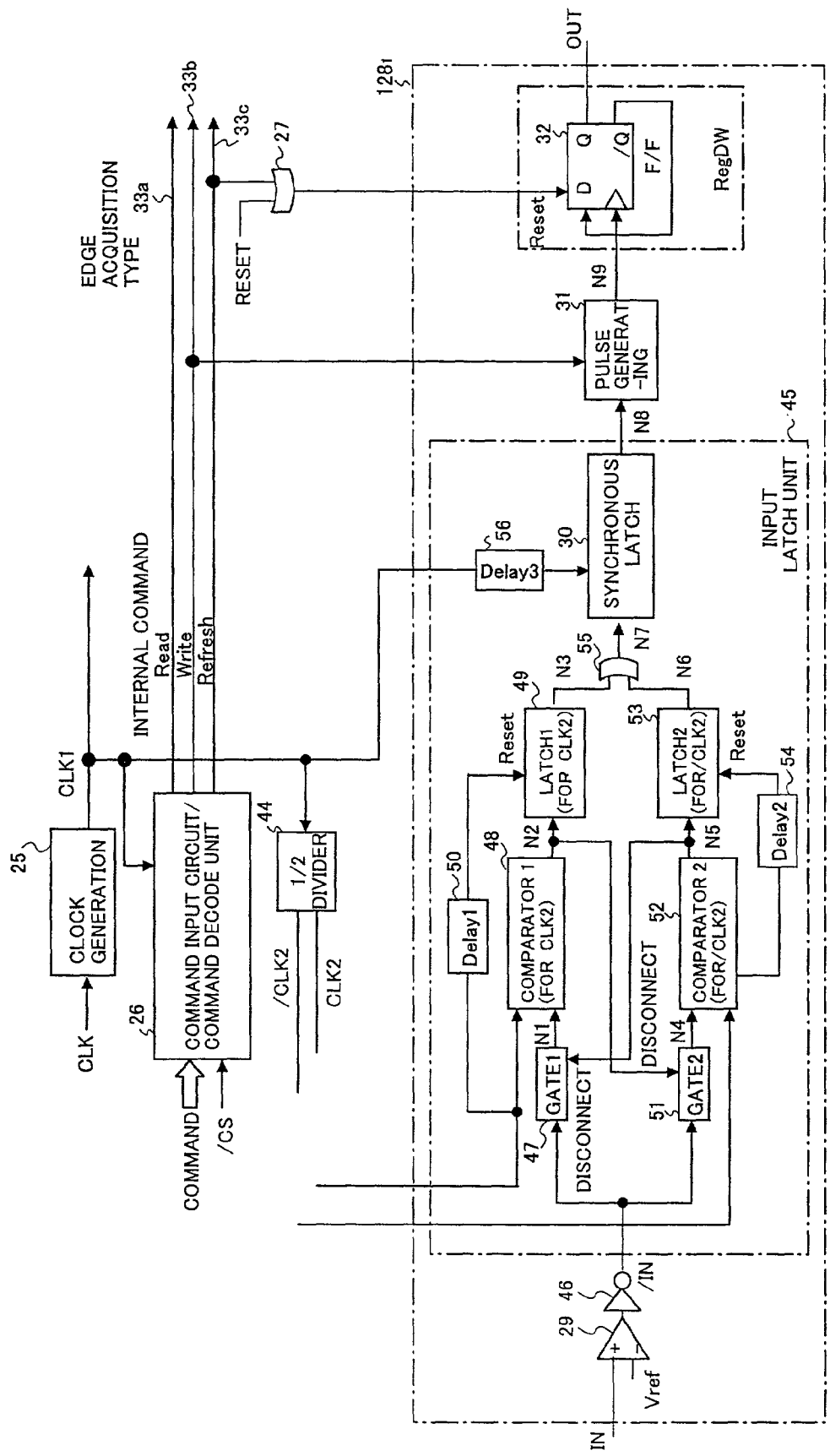
FIG. 6 is a block diagram showing the second embodiment of the data input circuit provided in the memory.

FIG. 6 is a block diagram showing the configuration of the data input unit according to the second embodiment of the present invention. Each unit which is identical to one shown in FIG. 3 is referred to by the same numeral as used in FIG. 3. The second example is a data input unit which is activated by a low-edge, which is an edge observed when voltage goes down to LOW from HIGH.

Data input units $128_1$-$128_n$ are provided instead of the data input units $28_1$-$28_n$ shown in FIG. 3. In FIG. 6, however, only the data input unit $128_1$ is shown. A ½ frequency divider 44 is provided. The divider divides an internal clock CLK1 by a ratio of 2, and generates two internal clock signals CLK2 and /CLK2, which are complementary to each other.

The data input unit $128_1$ includes a comparator 29, an inverter 46, an input latch unit 45, a pulse generating unit 31, and a write register RegDW including a flip-flop 32. The input latch 45 detects a low-edge of data IN, and includes two series of detecting units which operate alternately. One of two series of detecting units, hereinafter referred to as the first low-edge detecting unit, operates based on the internal clock CLK2, and includes a gate 47, a comparator 48, a latch 49, and a delay unit 50. The other series, hereinafter referred to as the second low-edge detecting unit, operates based on the internal clock /CLK2, and includes a gate 51, a comparator 52, a latch 53, and a delay unit 54. For the clarity of description, the name of each unit is followed by a number, either "1" or "2", to clearly indicate which series the unit belongs to. The input latch unit 45 includes an OR gate 55, a delay unit 56, and a synchronous latch 30.

Figure 7:
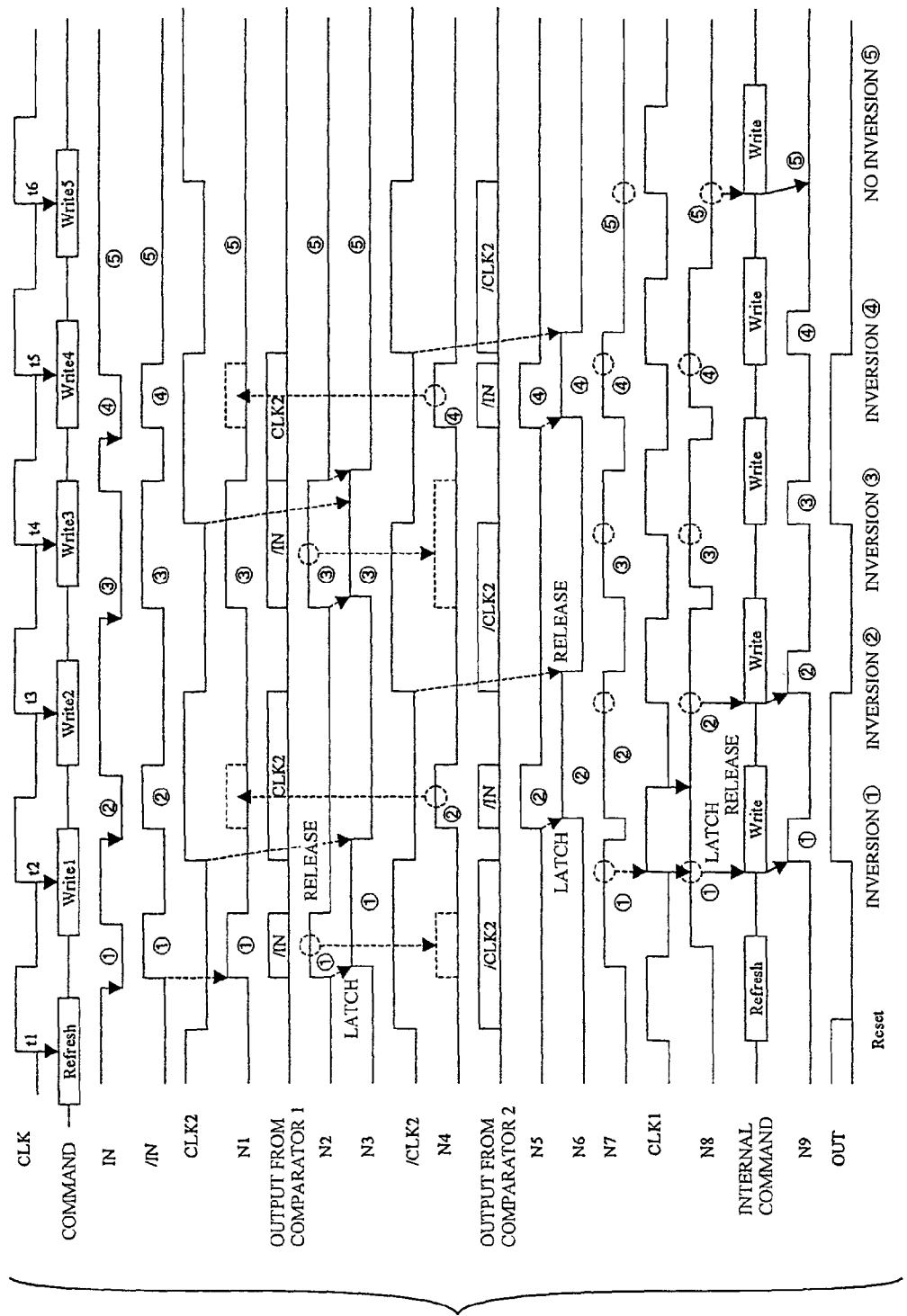
FIG. 7 is a timing chart of the circuit operation shown in FIG. 6.

FIG. 7 is a timing chart showing the operation of the data input unit shown in FIG. 6. FIG. 7 shows the timing relationship between the clock CLK and the data IN. A pulse ① of the data IN, whose low-edge is detected during the period between timings t1 and t2 of the clock CLK, is acquired when a write command Write1 is received. Similarly, a pulse ② is acquired when a write command Write2 is received. Though a pulse ③ remains low after a timing t4 of the clock CLK, the pulse ③ is also acquired when a write command Write3 is received because the low-edge of the pulse ③ is in the period between timings t3 and t4. The part of the pulse ③, which remains low after the timing t4 of the clock CLK, is ignored, and a pulse ④ is detected during the period between timings t4 and t5. No pulse is detected, however, when a write command Write5 is received because there is no low-edge of the data IN during the period between timings t5 and t6 of the clock CLK. If the write command Write2 is not received, the pulse ② would be ignored.

As previously described, the first low-edge detecting unit of the input latch unit 45 detects a low-edge of the data IN during the period in which the internal clock CLK2 is low. The second low-edge detecting unit detects a low-edge of the data IN during the period in which the internal clock /CLK2, which is complementary to CLK2, is low. By operating the first low-edge detector and the second low-edge detector alternately, all low-edges of the data IN can be detected.

It is assumed that the data IN is inverted by an inverter 46 and "/IN" is input, because it is easier to describe FIG. 7 using HIGH pulses as inputs than LOW pulses.

The operation of the first low-edge detection unit will be described below. While the internal clock CLK2 remains at the HIGH level, the latch 49 remains in a reset state, and its output N3 remains at the LOW level. When the internal clock CLK2 falls to the LOW level, the latch 49 is released, and waits for the output N2 of the comparator 48 to rise to the HIGH level. The gate 47 is open during this period. The operation of the gate 47 will be described in detail later. When a LOW pulse is input to the data IN, a HIGH pulse is generated at a node N1. The comparator 48 determines which one of the high-edges (edges where the voltage goes up from the LOW level to the HIGH level) comes first, i.e., the high-edge of the internal clock CLK2 or the high-edge of the node N1. In case that the HIGH edge of the node N1 comes first, the output N2 turns to HIGH, and is latched by the latch 49. The HIGH level signal is transferred through the nodes N3 and N7, is latched by the synchronous latch 30 in synchronism with the internal clock CLK1, and is output to the pulse generator 31 as an output signal N8. The control line 33b turns ON when a write command corresponding to the data IN is input, i.e., when an internal write command is issued. The pulse generator 31, by generating a pulse N9, inverts the state of the flip-flop 32. As shown in FIG. 7, an output OUT is inverted from "0" to "1". This inversion is indicated as "inversion ①" in FIG. 7.

The latch 49 is necessary to keep the output of the comparator 48. Otherwise, the output would vanish as an IN pulse goes off while the internal clock CLK2 is at the LOW level, as shown in FIG. 7 as IN①.

The gate 47 cuts a back portion of the input pulse which remains at the LOW level after the clock CLK rises to the HIGH level shown in FIG. 7 as IN③. The node N2 of the comparator 48 turns to the HIGH level if the node N1 rises to the HIGH level before the internal clock CLK2 turns to the HIGH level, and the node N2 remains at the HIGH level as long as the node N1 remains at the HIGH level. While the node N2 is at the HIGH level, the gate 2 is disconnected. The data IN does not go through the second low edge detection unit. When the node N1 falls to the LOW level, the node N2 turns to the LOW level, and consequently, the gate 51 turns to a connection state. The second low edge detection circuit acquires the data IN if a pulse is input while the internal clock "/CLK2" is at the LOW level.

An input pulse whose pulse width, or the length of LOW level, is longer than one clock period is prohibited as a rule. The latch 49 is reset when it receives the output of the delay circuit 50 which delays the internal clock CLK2 for a certain period of time. Similarly, the latch 53 is reset when it receives the output of the delay circuit 54 which delays the internal clock /CLK2 for a certain period of time. The synchronous latch 30 is reset when it receives the output of the delay circuit 56 which delays the internal clock CLK1 for a certain period of time.

Figure 8:
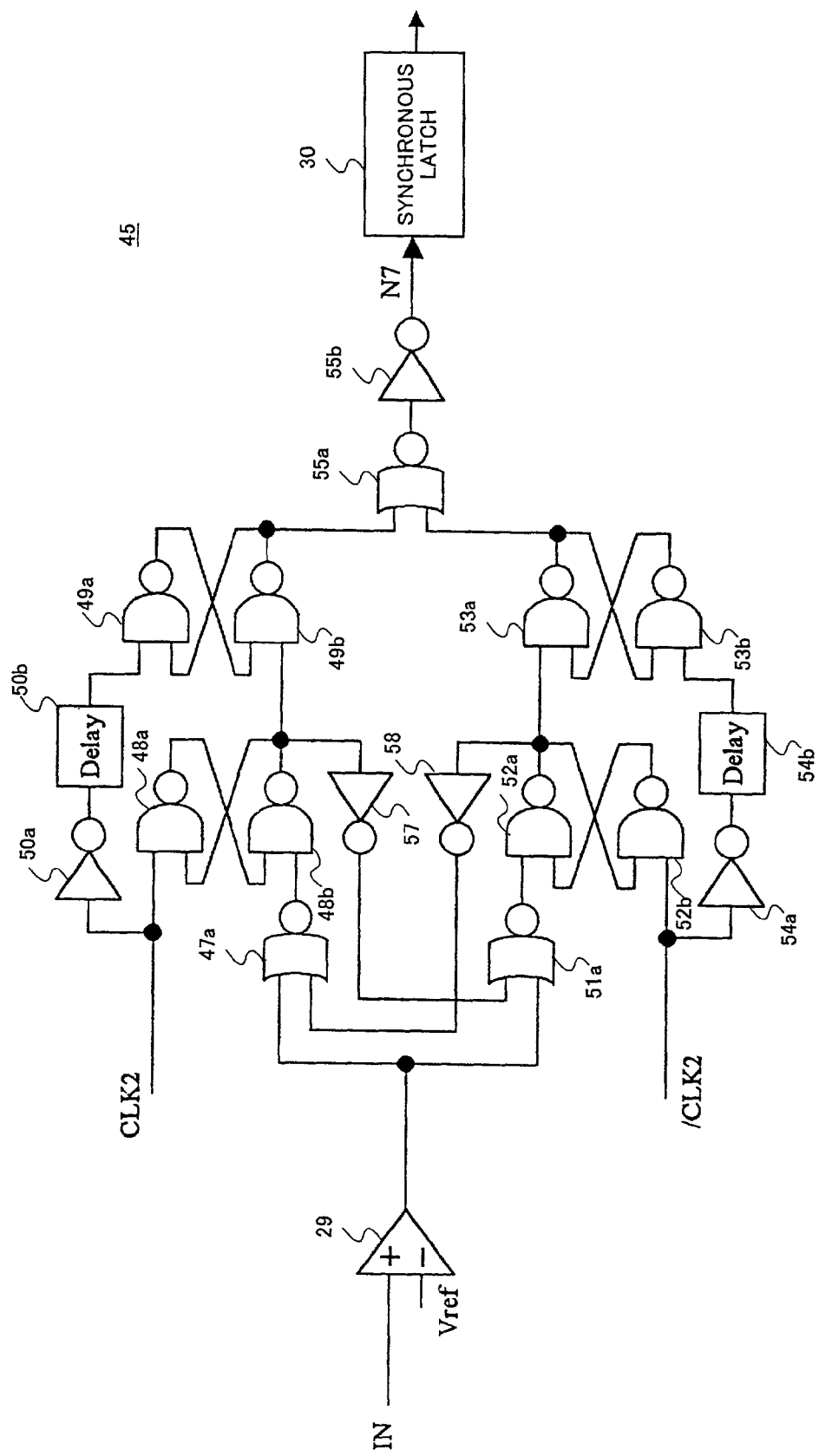
FIG. 8 is a circuit diagram of an embodiment of input latch unit shown in FIG. 6.

FIG. 8 is a circuit diagram showing an example of circuit which embodies the data input unit shown in FIG. 6. The gate 47 includes a NOR gate 47a. The NOR gate 47a calculates NOR of the output of the comparator 29 and the output of the inverter 58. The comparator 48 includes two NAND gates 48a and 48b. The latch 49 includes two NAND gates 49a and 49b. The delay circuit 50 includes an inverter 50a and a delay component 50b. Similarly, the gate 51 includes a NOR gate 51a. The NOR gate 51a calculates NOR operation of the output of the comparator 29 and the output of inverter 57. The comparator 52 includes two NAND gates 52a and 52b. The latch 53 includes two NAND gates 53a and 53b. The delay circuit 54 includes an inverter 54a and a delay component 54b. The OR gate 55 includes a NOR gate 55a and an inverter 55b.

The circuit described in FIG. 8 operates as shown in the timing chart in FIG. 7.

Third Embodiment of Data Input Unit Provided in Memory

Figure 9:
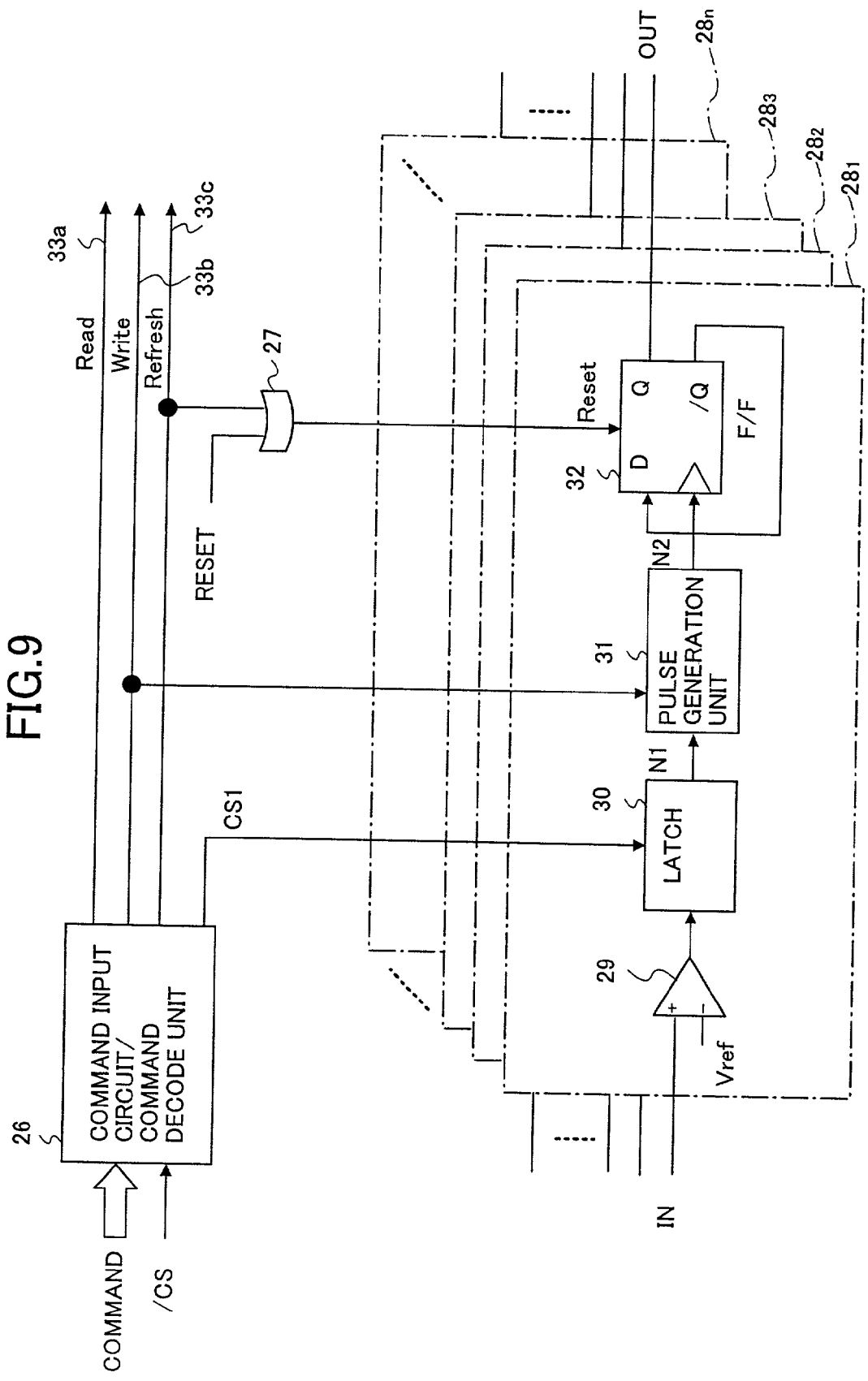
FIG. 9 is a block diagram of the third embodiment of a data input unit provided in a memory.
Figure 10:
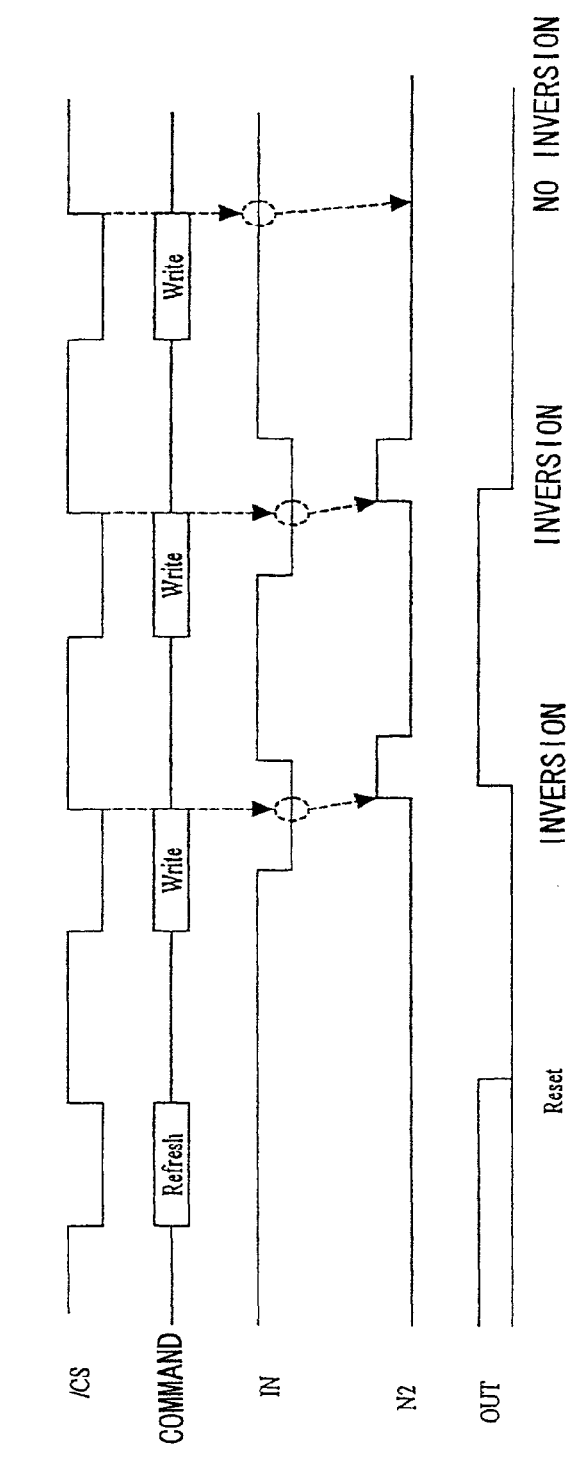
FIG. 10 is a timing chart of a circuit operation shown in FIG. 9.

FIG. 9 shows the third embodiment the data input unit provided in the interface units 19a-19d of the memories 13a-13d. A data input unit to be described as the third embodiment is a unit which acquires data IN at the rise of a chip select signal "CS". Common components to both FIG. 3 and FIG. 9 are referred to by the same numerals.

Figure 11:
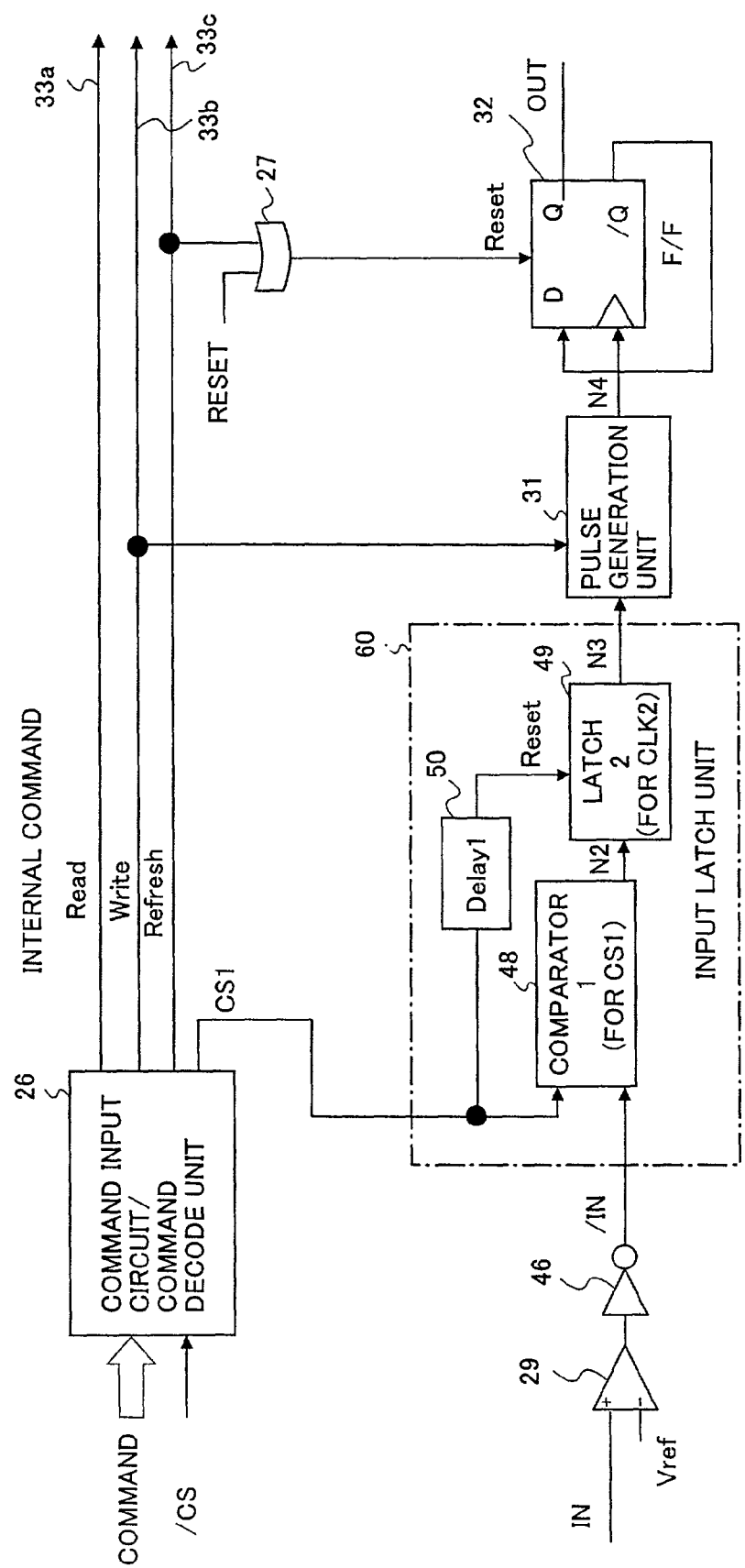
FIG. 11 is a block diagram showing a fourth embodiment of a data input unit provided in a memory.

Compared with the circuit described in FIG. 6, the circuit shown in FIG. 11 includes an input latch unit 60, instead of the input latch unit 45 in FIG. 6, and does not include the ½ divider 44 shown in FIG. 6. The input latch 60 includes a comparator 48, a latch 49, and a delay circuit 50. While a chip select signal "/CS" (CS1) is ON (Input Waiting Period), the input latch 60 outputs a signal N3 to the pulse generator 31 in response to a HIGH edge of the inverted input data "/IN" through the inverter 46.

Figure 12:
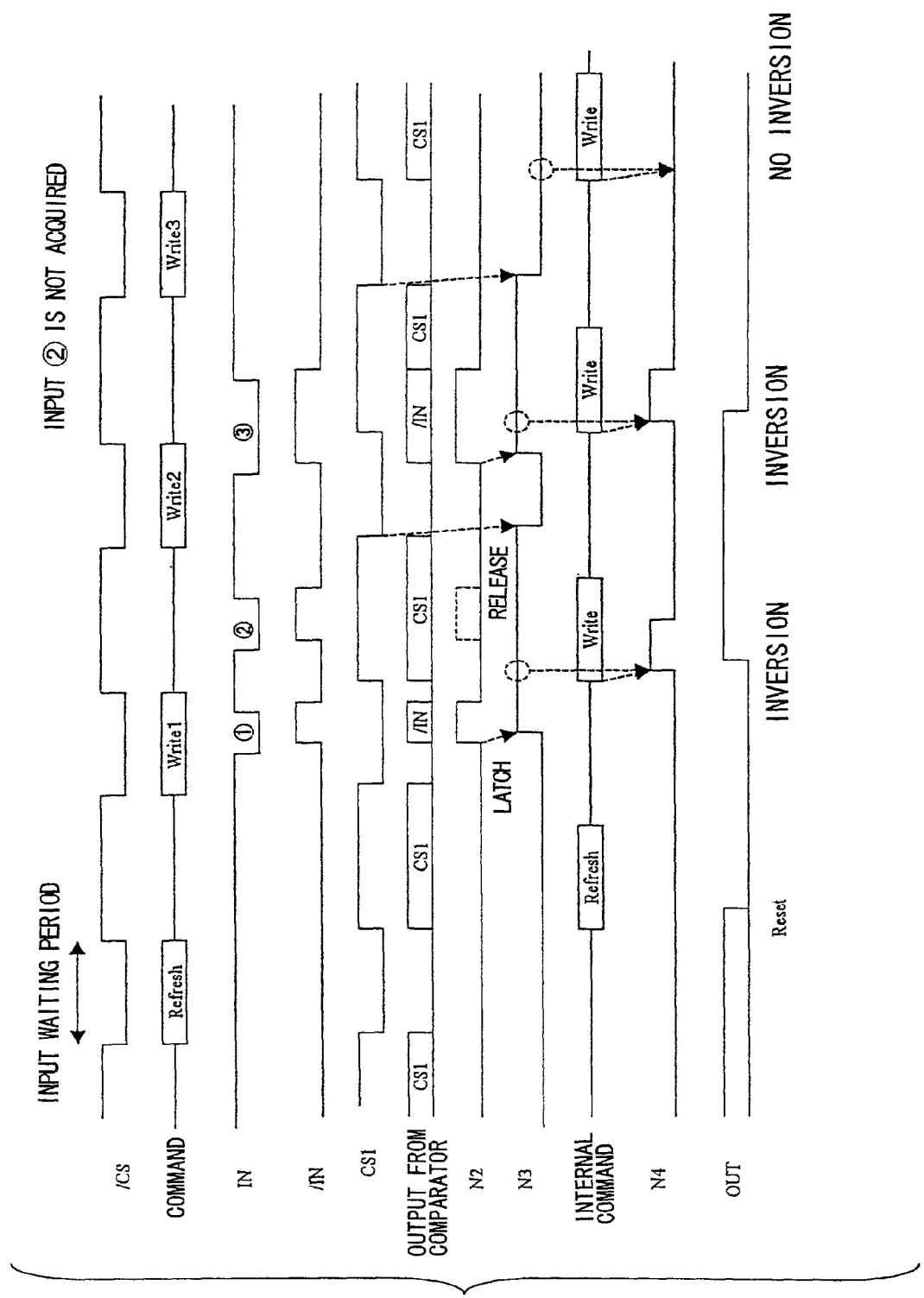
FIG. 12 is a timing chart showing a circuit operation shown in FIG. 11.

FIG. 12 is a timing chart illustrating the operation of the circuit shown in FIG. 11. The first data IN after a refresh is a LOW pulse ①. The comparator 48 sends a pulse N2 to the latch 49 because the inverted data "/IN" rises from LOW to HIGH during the Input Waiting Period of the internal chip select signal CS1. The latch 49 keeps a HIGH pulse, and sends a HIGH level signal N3 to the pulse generator 31. While the control line 33b is ON in accordance with a write command Write1 (in other words, by receiving an internal write command), the pulse generator 31 is in an Enable state. The pulse generator 31, when it receives a HIGH level signal N3, sends a pulse N4 to the flip-flop 32. When the flip-flop receives the pulse N4, it inverts the state thereof, and consequently changes its output from LOW to HIGH.

At the timing of the next LOW pulse ② of the data IN, the comparator 48 does not detect this LOW pulse because the chip select signal CS1 is OFF. On the graph showing the signal (node) N2 in FIG. 12, a pulse which is not detected by the comparator 48 and consequently is not latched by the input latch 60 is shown with dotted lines.

The latch 49 is reset by the output of the delay circuit 50 which delays the internal chip select signal CS1 for a predetermined period of time. In this example shown in FIG. 12, the predetermined period is assumed as a half of the cycle of the internal chip select signal CS1.

The next LOW pulse ③ of the data IN is processed in the same manner as the LOW pulse ① previously described. The state of the flip-flop changes in accordance with the LOW pulses of the write data ① and ③, and the output OUT of the flip-flop turns in the order of LOW, HIGH, and LOW.

Fifth Embodiment of Data Input Unit Provided in Memory

The fifth embodiment of the data input unit provided in the interfaces 19a-19d of the memories 13a-13d will be described below with reference to FIG. 13. The fifth example is a data input unit which detects LOW edges of the data IN in an asynchronous manner. This is an improvement over the fourth example. Common components to both FIG. 6 and 13 are referred to by the same numerals.

Figure 13:
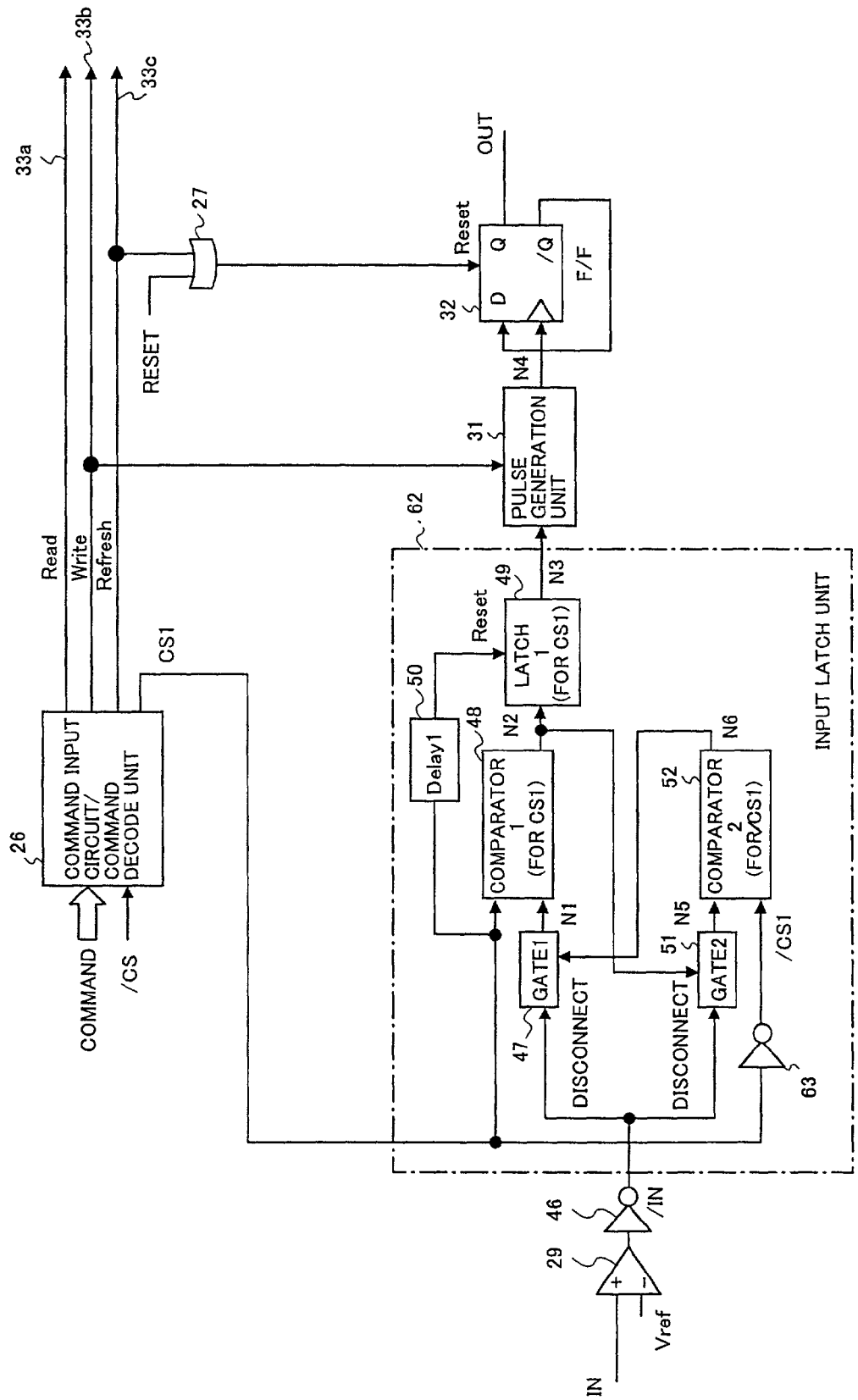
FIG. 13 is a block diagram of the fifth embodiment of a data input unit provided in a memory.

The circuit of the fifth example is similar to that of FIG. 6, but its input latch unit 62 includes a low-edge detection unit as shown in FIG. 13. This low-edge detection unit includes a gate 47, a comparator 48, a latch 49, and a delay circuit 50. The circuit comprising a gate 51, a comparator 52, and an inverter 63, switches ON and OFF the gate 47.

Figure 14:
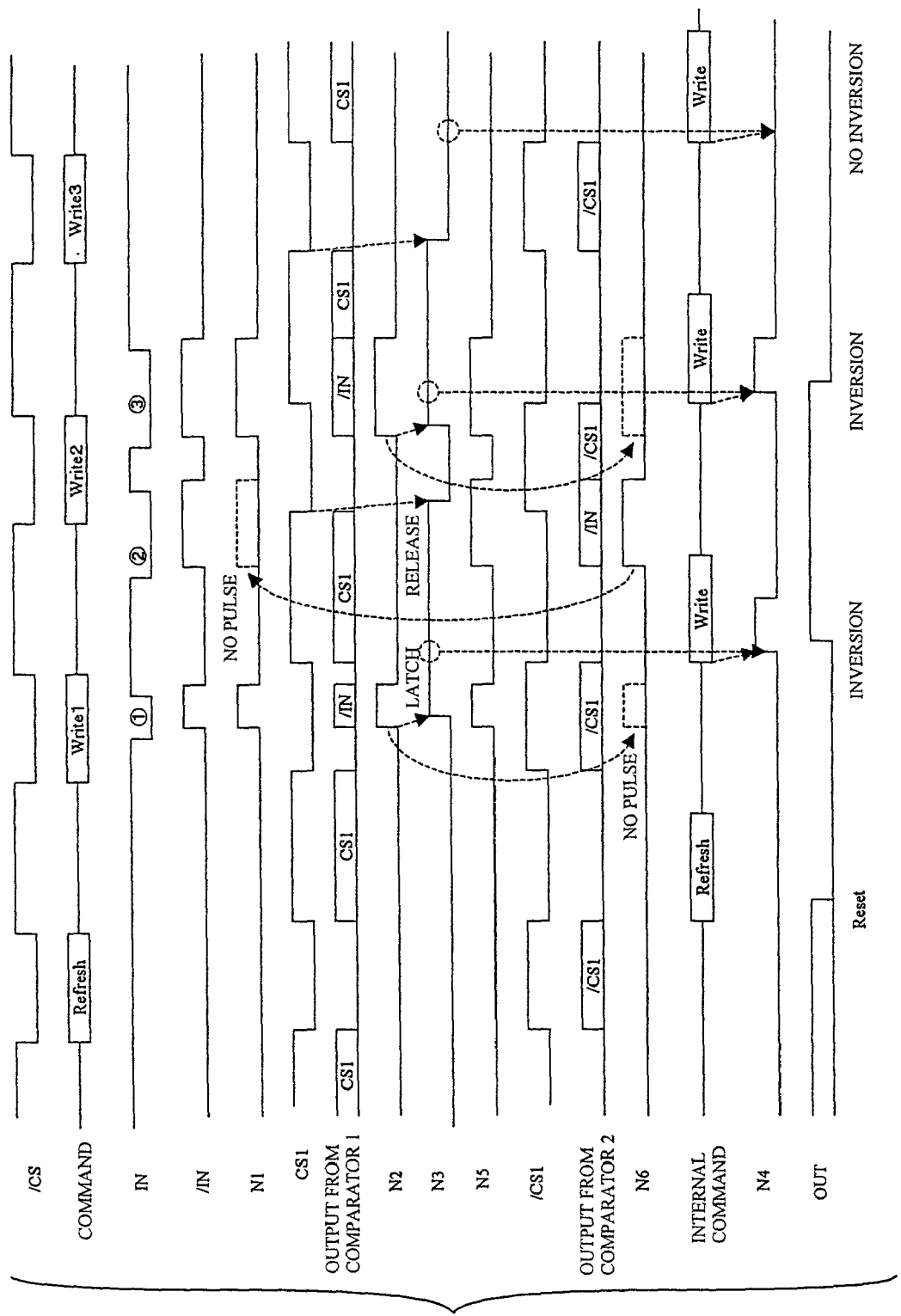
FIG. 14 is a timing chart of the circuit shown in FIG. 13.

FIG. 14 is a timing chart showing the operation of the fifth example described in FIG. 13. An LOW pulse ① of the data IN is converted to a HIGH pulse of the data "/IN" by passing through an inverter 46, and is input, through the gate 47, to a comparator 48 as N1. The comparator 48, which is selected by an internal chip select LOW-level signal CS1, outputs a HIGH pulse output N2 to the latch 49 and the gate 51. The latch 49 latches this HIGH pulse, outputs an HIGH level output N3 to a pulse generator 31. The pulse generator 31, responding to an internal command Write obtained by decoding a write command Write1, sends a pulse output N4 to a flip-flop 32. Consequently, the output OUT changes from a LOW level to a HIGH level.

On the other hand, because the gate 51 is open in response to the HIGH pulse N2, the inverted data "/IN" passes through the gate 51 and is output to the comparator 52. Because the inverted internal chip select signal "/CS1" is at the HIGH level, the comparator 52 cannot detect a rise of the inverted data "/IN", and the output N6 remains at the LOW level. The gate 47 is open because of the LOW level output N6.

When the next LOW pulse ② of the input data IN arrives, the comparators 48 and 52 are in a disable state and in an enable state, respectively, because the internal chip select signal CS1 is at the HIGH level. The gate 51 is open because a node N2 is at the LOW level. The comparator 52 detects a rise of the inverted data "/IN", and switches its output N6 to the HIGH level. Because the output N6 switches off the gate 47, its output N1 becomes LOW level. The output of the comparator 48 is also LOW. The latch 49, however, remains at the HIGH level. In summary, the input latch unit 62 does not detect an LOW pulse ②, or does not latch, because it ignores a LOW pulse ②, that falls to the LOW level before the chip select signal "/CS" falls to the LOW level.

The latch 49 is reset in response to the output of the delay circuit 50 which delays the internal chip select signal CS1 by a predetermined period. In other words, the latch 49 is released.

The next LOW pulse ③ inverts the flip-flop 32 in the same manner as the pulse ① described above.

As described above, the output OUT changes twice in the order of LOW→HIGH→LOW in response to 3 pulses ①, ②, and ③ of the data IN.

Though the chip select signal "/CS" is used to acquire the data IN in the third through fifth embodiments described above, any other command may be used for the same purpose.

Sixth Embodiment of Data Input Unit of Memory

The sixth embodiment of the data input units provided in the interface units 19a-19d of the memories 13a-13d will be described next with reference to FIG. 15. The sixth embodiment is an improvement in electric power consumption of the first embodiment shown in FIG. 3. Common components to both embodiments shown in FIG. 3 and FIG. 15 are referred to by the same numerals.

Figure 15:
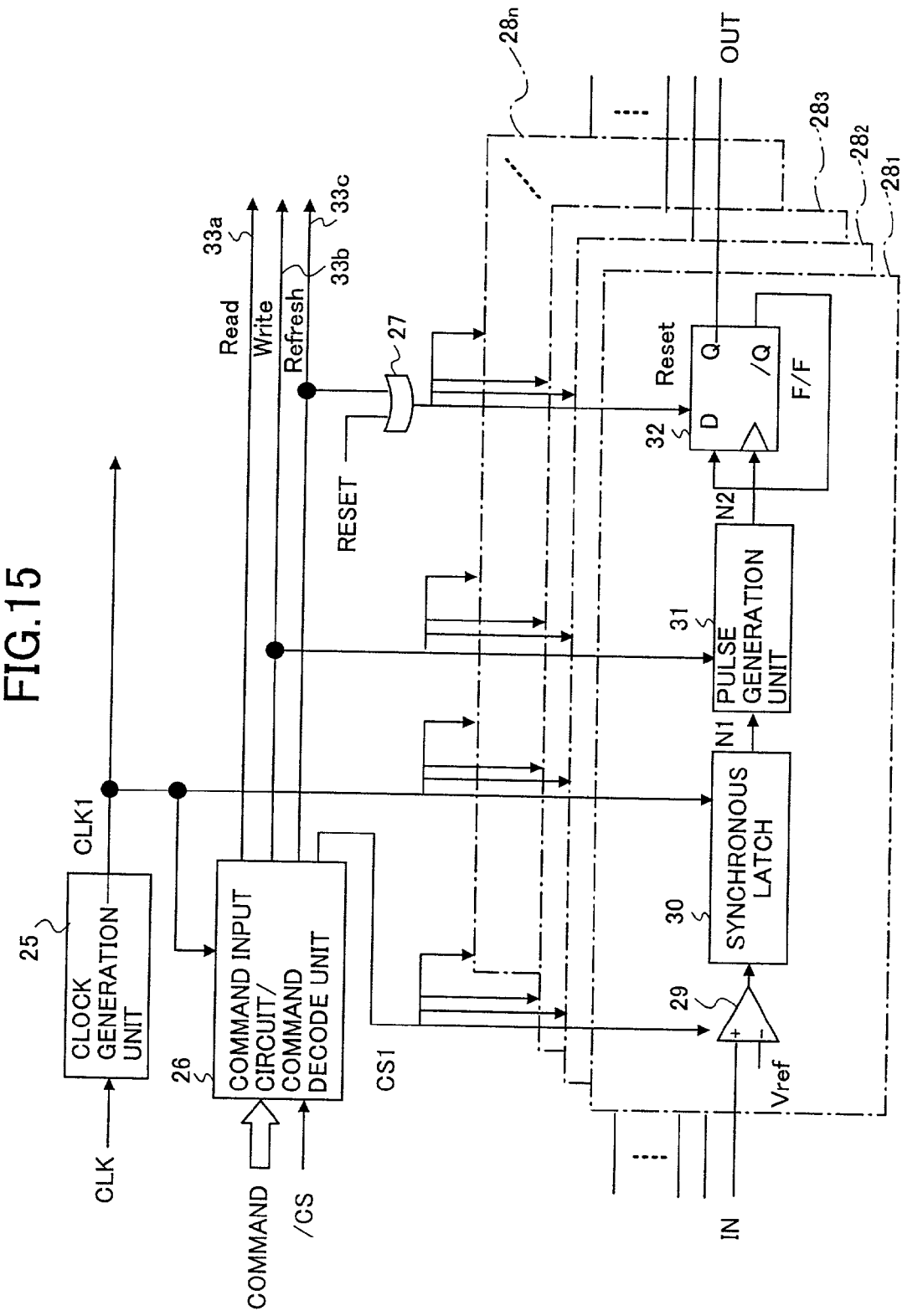
FIG. 15 is a block diagram of the fifth embodiment of a data input unit provided in a memory.

In this circuit configuration shown in FIG. 15, the front end unit comprising a comparator 29 is activated by an internal chip select signal CS1 which is an output of a command input circuit/command decode unit 26. This embodiment differs from one shown in FIG. 3 in this respect. The comparator 29 is in an enable state, or activated, only while the internal chip select signal CS1 is ON. While CS1 is OFF, the comparator 29 remains at a disable state. The comparator 29 does not waste electric power when a data input unit having the comparator 29 provided therein is not selected.

Figure 16:
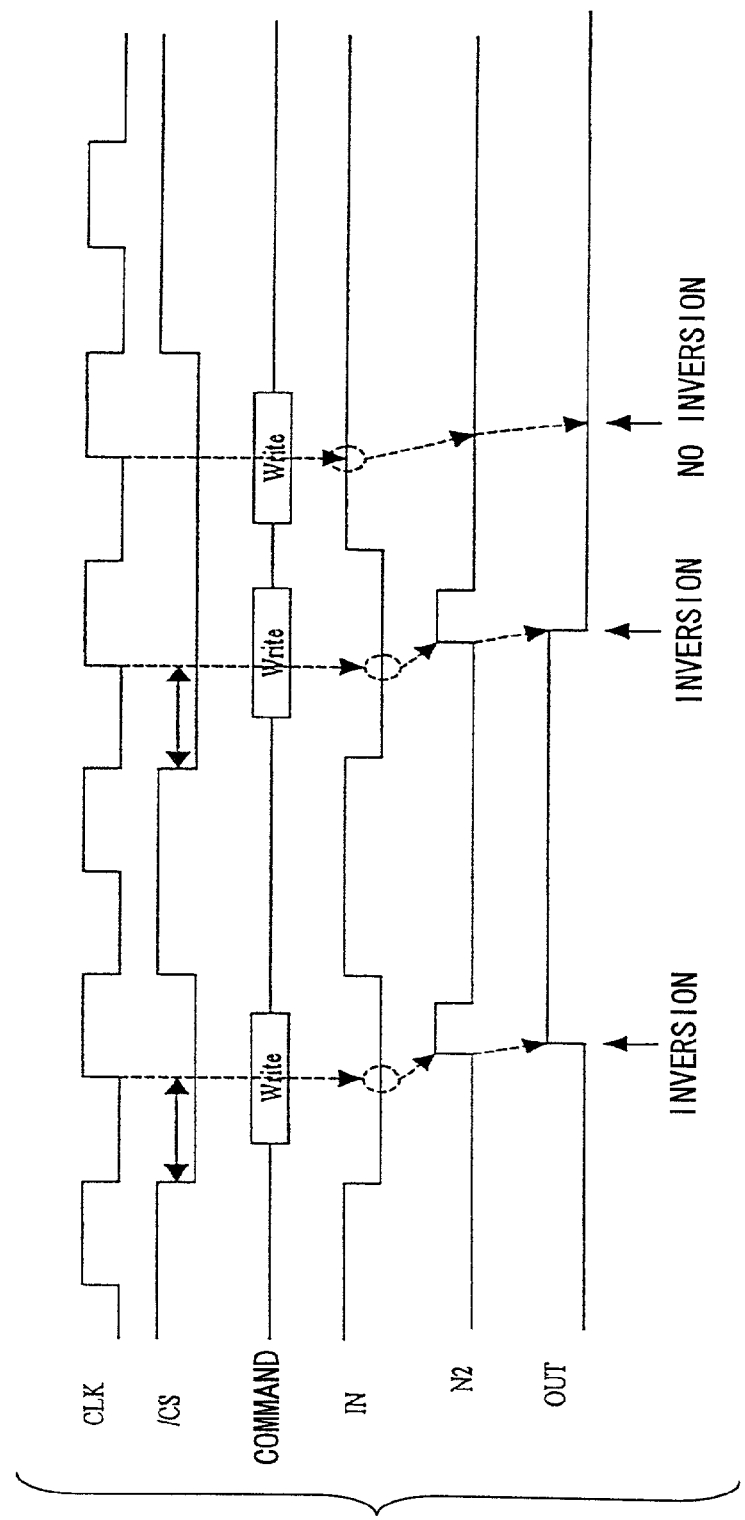
FIG. 16 is a timing chart of the circuit shown in FIG. 15.

FIG. 16 is a timing chart showing the circuit operation shown in FIG. 15. The comparator 29 is in an enable state in response to the chip select signal "/CS" which falls a predetermined period (in this example, ½ cycle of CLK) before the rise edge of a clock CLK by, so that the comparator 29 can detect a LOW level of the data IN.

This method, i.e., enabling the front end unit only when it needs to be activated is also applicable to the first through fifth embodiments in the same manner as the sixth embodiment.

Embodiment of Data Output Unit of Memory

Figure 17A:
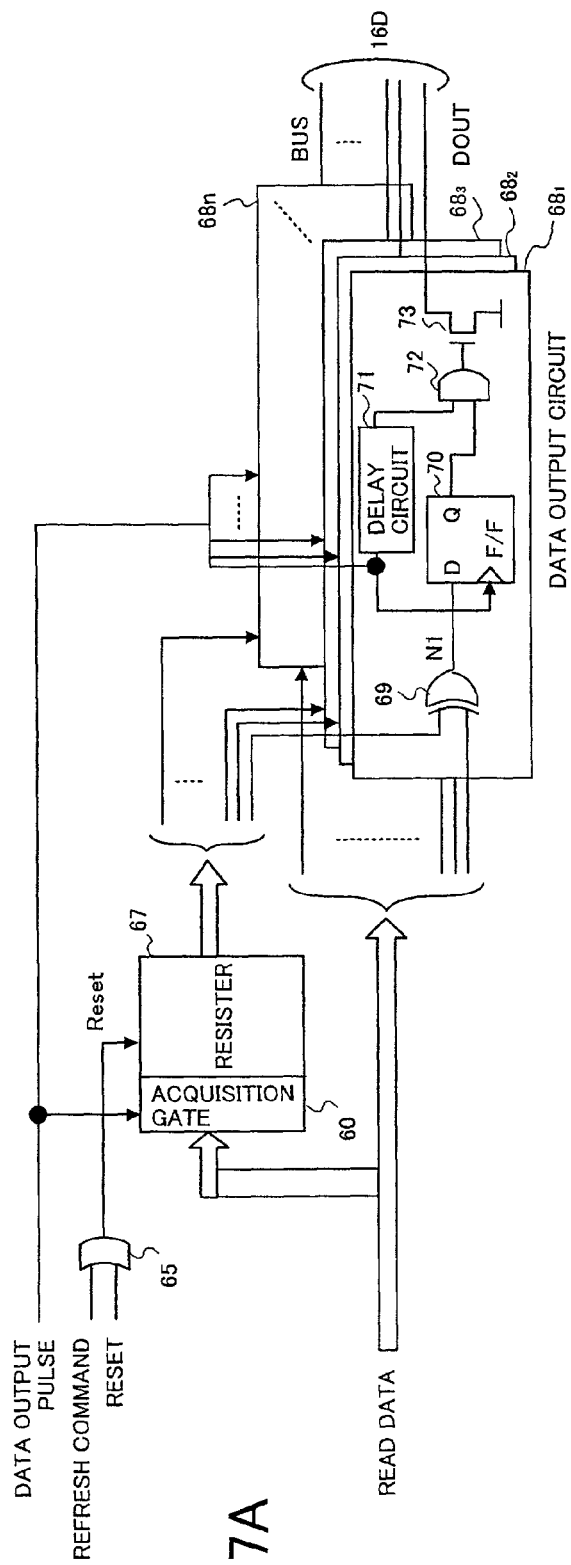
FIG. 17A is a block diagram of an embodiment of a data output unit provided in a memory.

With reference to FIG. 17A, an embodiment of the data output unit included in the interface units 19a-19d of the memories 13a-13d will be described. The data output unit described below can be used as both a synchronous circuit and an asynchronous circuit.

The data output unit shown in FIG. 17A includes an OR gate 65, a acquisition gate 65, a register 67, and "n" data output circuits 68₁-68ₙ. Each of the data output circuits 68₁-68ₙ includes an Exclusive-Or gate 69, a flip-flop 70, a delay circuit 71, an AND gate 72, and a transistor 73. Output data obtained from memory cores (shown in FIG. 2) is input to both the acquisition gate 60 and the data output circuits 68₁-68ₙ which correspond to respective bits. The acquisition gate 60 is in a connection state in response to a data output pulse from the memory core, and sends read data to the register 67. A refresh command sent by the controller 10 through the command bus 16C (FIG. 2) or generated in the memory, or a reset signal generated internally is sent to the register 67 through the OR gate 65. In response to the refresh command or the reset signal, the register 67 is reset. The register 67 is reset whenever data is read.

Figure 17B:
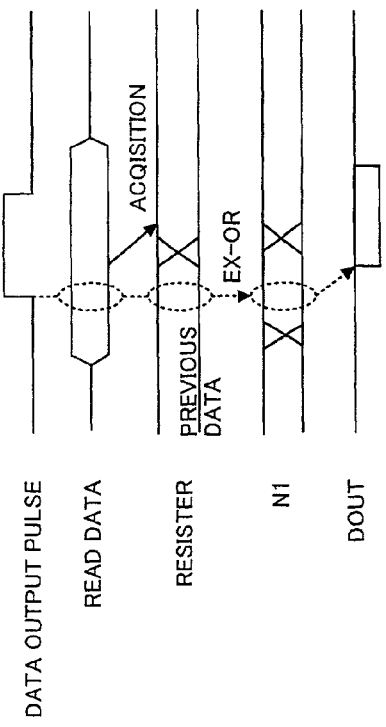
FIG. 17B is a timing chart showing a circuit operation shown in FIG. 17A.

The Exclusive-Or gate 69 in the data output circuit 68₁ calculates an Exclusive-Or of a bit of current read data and a corresponding bit of data retrieved from the register 67. The data retrieved from the register 67 is data read from the memory core just prior to the current read data. The Exclusive-Or gate 69 checks whether the read data is inverted or not, compared with the previous data. If the read data is inverted, the Exclusive-Or gate 69 outputs a HIGH level output N1 to the flip-flop 70. The flip-flop 70, in response to the data output pulse, latches the HIGH level output N1, and outputs HIGH as a "Q" output. The data output pulse is slightly delayed by the delay circuit 71, and sent to the AND gate 72. The AND gate 72 outputs a pulse having a pulse width equal to the timing difference between the "Q" output and the output from the delay circuit 71. The transistor 73 includes a field effect transistor such as an N-channel MOS transistor. As shown in FIG. 17B, the transistor 73, in response to the HIGH pulse output from the AND gate 72, sets a corresponding bus line of the data bus 16D at a ground level, or a low level. This configuration is a so-called open drain type where the drain of the transistor 73 is connected to the data bus line which is terminated with a resistor.

Embodiment of "/CS" Output Unit and Data Output Unit of Controller

Figure 18:
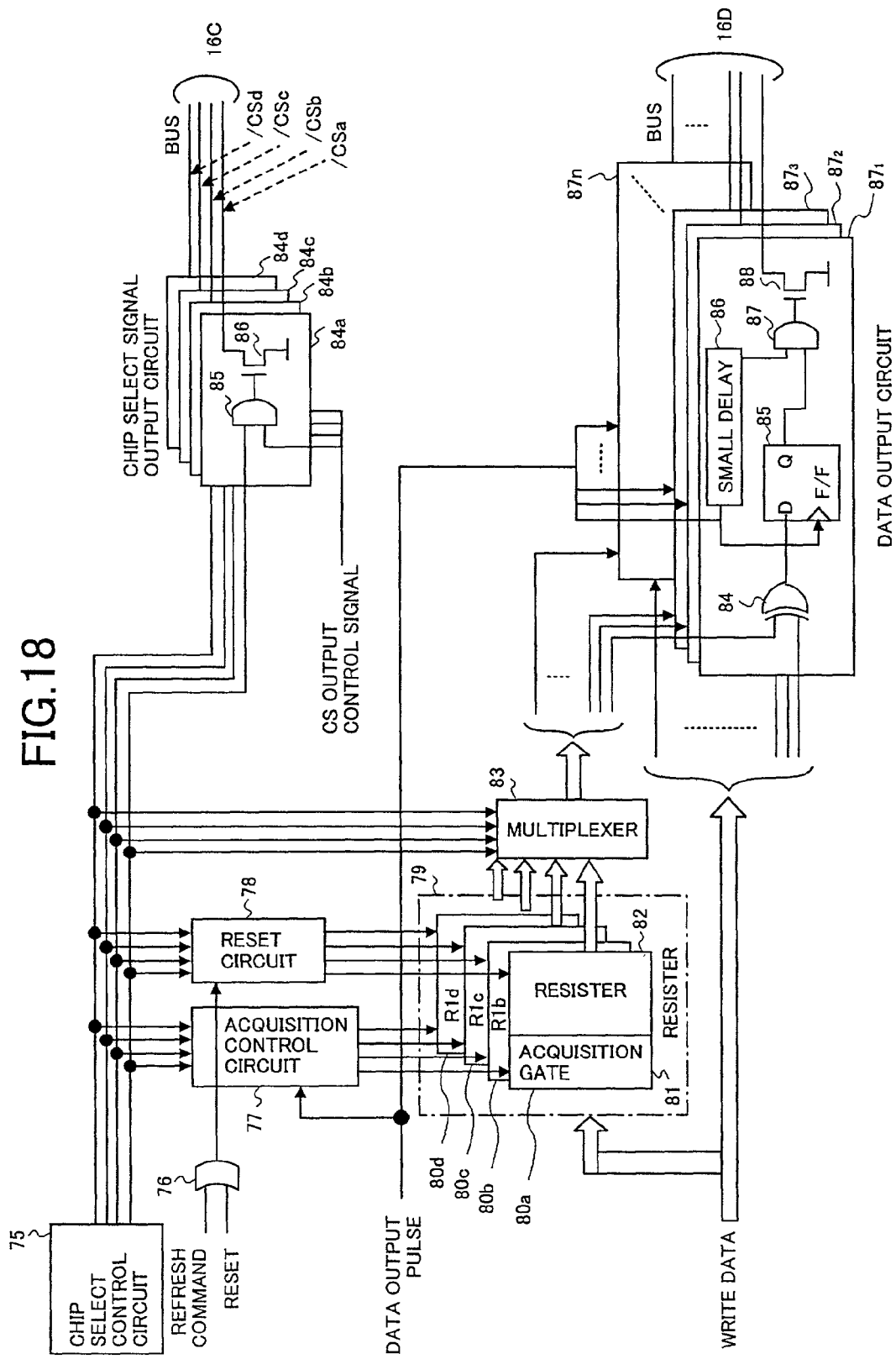
FIG. 18 is a block diagram of a first embodiment of a "/CS" output unit and a data output unit provided in a controller.

An embodiment of the chip select signal output unit (hereinafter referred to as "/CS" output unit) and data output unit included in the controller 10 will be described with reference to FIG. 18.

A "/CS" output unit in the controller 10 includes a chip select control circuit 75 and chip select signal output circuits 84a-84d. The chip select control circuit 75 issues a chip select signal to activate four memories 13a-13d shown in FIG. 2, and sends the signal to the chip select signal output circuit 84a-84d. Each chip select signal output circuit 84a-84d includes an AND gate 85 and a field effect transistor 86 such as NMOS transistor. The AND gate 85 receives a corresponding chip select signal and a CS output control signal. The CS output control signal is an output from a control unit in the controller 10 (not shown), and is switched ON when a chip is activated. The output of the AND gate 85 controls the gate of the transistor 86. The AND gate 86 of the chip select signal output circuit 84a-84d outputs active-low chip select signals "/CSa"-"/CSd". The chip select signals "/CSa"-"/CSd" are provided to the memories 13a-13d, shown in FIG. 2, through the command bus 16C, respectively.

The data output unit of the controller 10 includes an OR gate 76, a acquisition control circuit 77, a reset circuit 78, a group of registers 79, a multiplexer 83, and data output circuits 87₁-87ₙ. The group of registers 79 includes 4 register units 80a-80d corresponding to 4 memories 10a-10d. Each of the register units 80a-80d includes a acquisition gate 81 and a register 82. The register units 80a-80d are identical to the registers 17a-17d shown in FIG. 3. The interface unit 18 shown in FIG. 3 includes a multiplexer 83 and data output circuits 87₁-87ₙ.

Write data is provided to the group of registers 79, and, is also provided, bit by bit, to the data output circuits 87₁-87ₙ. The acquisition control circuit 77 receives 4 chip select signals, and activates, in response to a data output pulse, the acquisition gates 81 of the register units 80a-80d corresponding to the chip select signal which is ON (or enabled). A write data is stored in the register 82 of the corresponding unit through the activated acquisition gate. The reset circuit 78 resets the register 82 of the selected unit by the chip select signal in response to a refresh command or a reset signal provided by the internal circuit of the controller 10 through the OR gate 76.

Write data obtained from the register 82 of the register unit 80a-80d is provided, bit by bit, to the corresponding data output circuit $87_1$-$87_n$ through the multiplexer 83.

Each of the data output circuits $87_1$-$87_n$ includes an Exclusive-Or gate 84, a flip-flop 85, a delay circuit 86, an AND gate 87, and a field effect transistor such as an NMOS transistor. This configuration is equivalent to the data output circuit $68_1$-$68_n$ shown in FIG. 17A. The Exclusive-Or gate 84 receives both the corresponding bit output from the multiplexer 83 and the corresponding bit of the write data, calculates an Exclusive-Or operation, outputs the result of the operation to the flip-flop 85. The write data obtained from the multiplexer 83 is write data that is processed just prior to the write data to be processed. Accordingly, this Exclusive-Or operation checks whether the data is an inversion of the previous data. If the data is inverted, the Exclusive-Or 84 gate sends a HIGH level outputs to the flip-flop 85. The flip-flop 85, in response to the data output pulse, latches the HIGH level output, and sets the "Q" output at a HIGH level. The data output pulse is slightly delayed by passing the delay circuit 86, and provided to the AND gate 87. The AND gate 87 generates a pulse whose pulse width is equal to the timing difference between the "Q" output and the output from the delay circuit 86. The transistor 88 is a field effect transistors such as N-channel MOS transistor, and sets the corresponding bus line of the data bus 16D at a ground level in response to the HIGH pulse sent by the AND gate 87.

Embodiment of Data Input Unit of Controller

Figure 19:
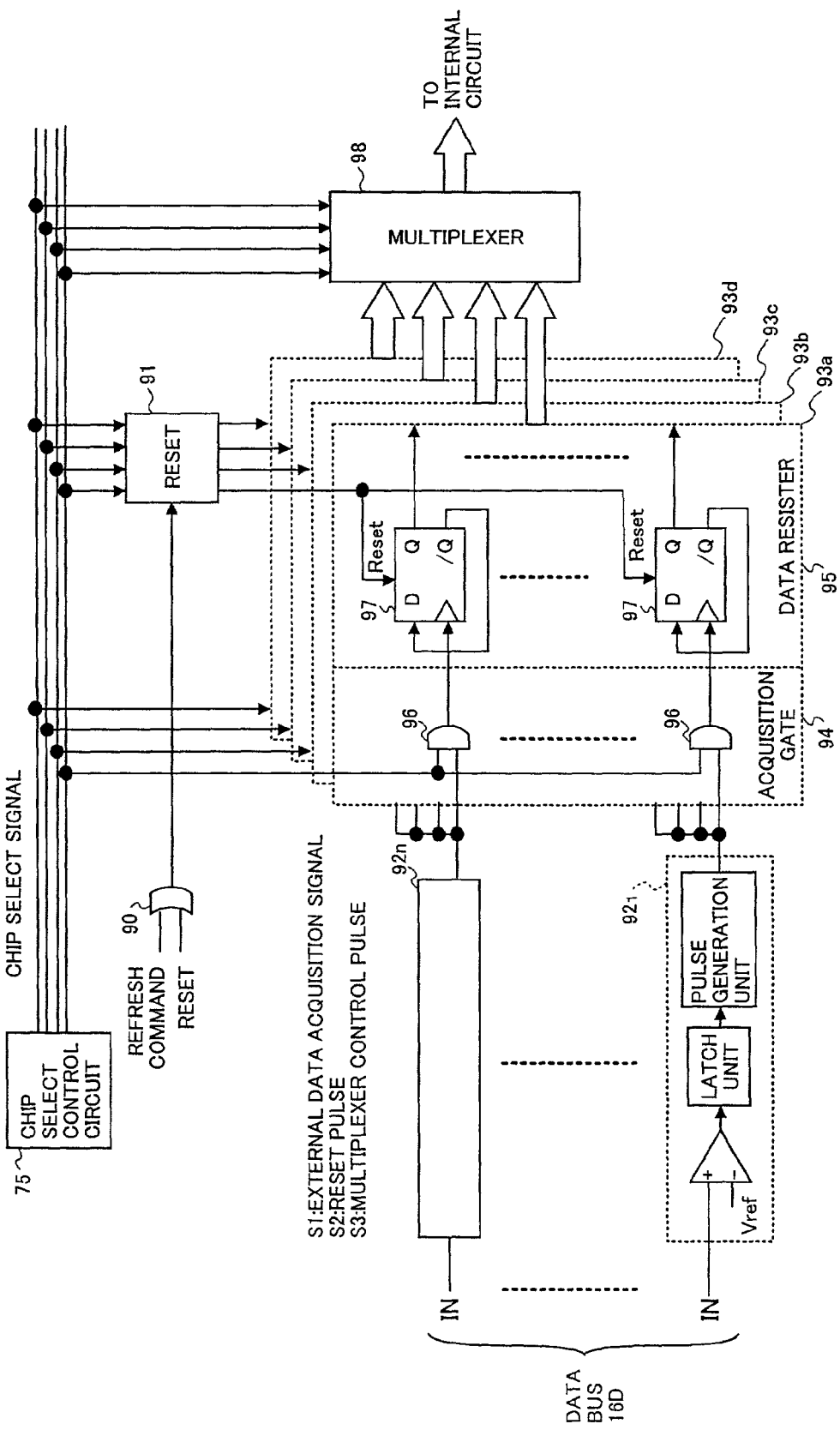
FIG. 19 is a block diagram of an embodiment of a data input unit provided in a controller.

With reference to FIG. 19, an embodiment of the data input unit included in the controller 10 will be described.

The data input unit of the controller 10 includes a chip select circuit 75, an OR gate 90, a reset circuit 91, "n" input circuits $91_1$-$91_n$, register units 93a-93d corresponding to each of 4 memories 13a-13d, and a multiplexer 98. The data input unit receives write data from the data bus 16D, and sends the data to an internal circuit including a memory core.

The input circuits 921-92n receive the write data from the data bus 16D, and send the data to the register units 93a-93d. Each input circuit $92_1$-$92_n$ may include a comparator, a latch unit, and a pulse generating unit, and may be implemented in the same manner as the data input unit of the memories described as the first through sixth embodiments.

Each register unit 93a-93d includes a acquisition gate 94 including "n" AND gates 96, and a data register 95 including "n" flip-flops. The AND gate 96 receives both "n"-bit read data from the input circuit 921-92n, and the corresponding chip select signal. The output of the AND gate 96 is provided to a clock pin of the corresponding flip-flop 97. The "/Q" output of the flip-flop 97 is connected to the "D" input, and the "Q" output is connected to the multiplexer 98. The reset circuit 91, in response to a refresh command or a reset signal provided through the OR gate 90, resets the flip-flops 97 of one of the units 93a-93d which is selected by the chip select signal. The multiplexer 98 selects a unit corresponding to the ON chip select signal, and outputs read data obtained from the selected unit to the internal circuits such as the memory core.

Transferred data is reproduced by inverting a state of a corresponding flip-flop 97 of the data register 95 in response to an inversion data "1" (a LOW pulse) received by the input circuits $92_1$-$92_n$ and passed through the acquisition gate 94.

Embodiment of Data Input/Output Unit of Memory

Figure 20:
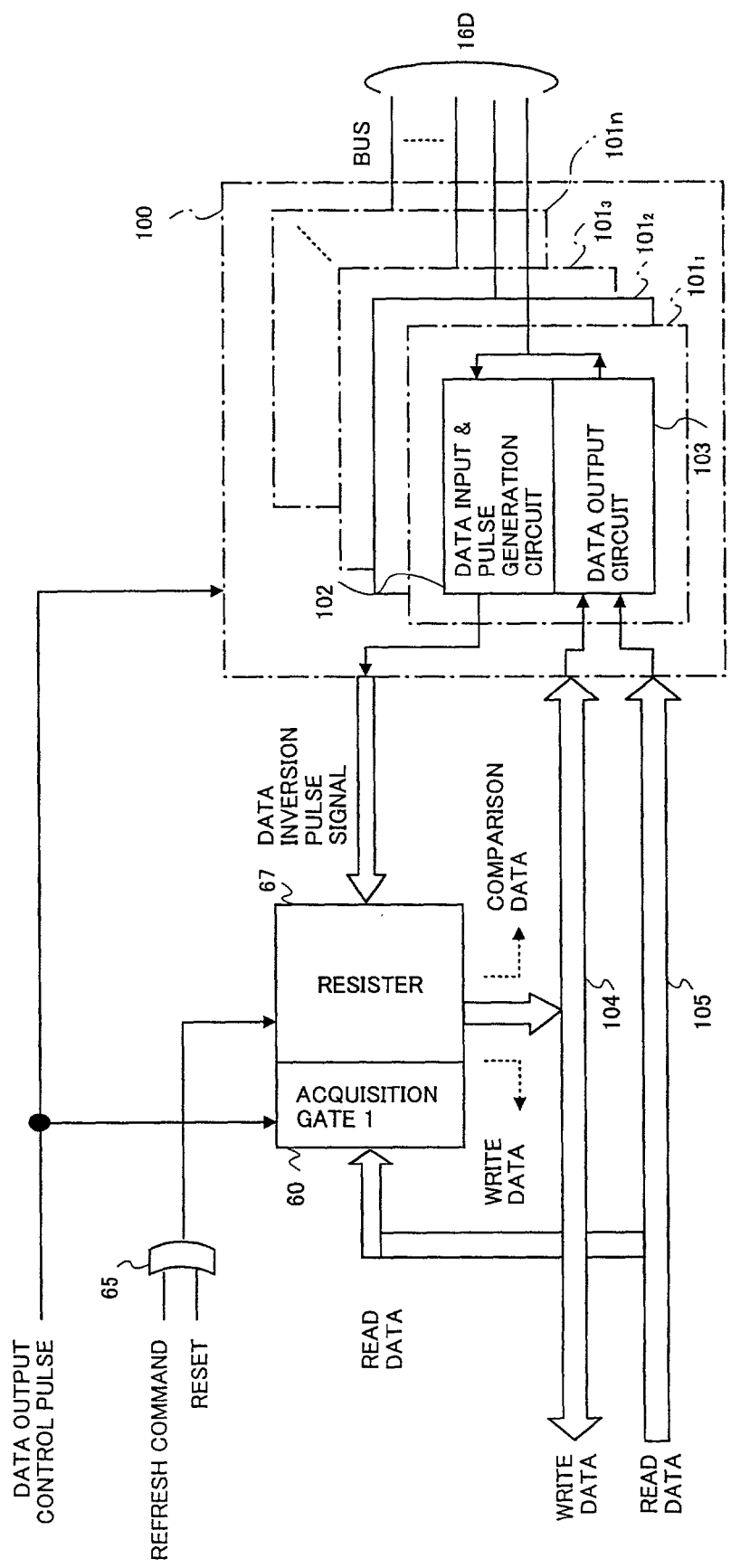
FIG. 20 is a block diagram of an embodiment of a data input/output circuit provided in a memory.

FIG. 20 illustrates the seventh embodiment of the data input/output unit included in the interface unit 19a-19d of the memories 13a-13d. A common data register is used as both a write data register RegDW and a read data register RegDR in this seventh embodiment. Common components to both FIG. 20 and the figures previously described are referred to by the same numerals.

A data input unit includes an OR gate 65, an acquisition gate 60, a register 67, and a data input/output unit 100. The data input/output unit 100 includes "n" data input/output units $101_1$-$101_n$. Each of the data input/output units $101_1$-$101_n$ includes a data input & pulse generation circuit 102 and a data output circuit 103. The data input circuit 102 can be any data input circuit, including up to the pulse generation unit 31, but excluding the write register RegDW, of the first through sixth embodiments previously mentioned. The write register RegDW corresponds to the register 67. The data output circuit 103 is the data output circuit $68_1$-$68_n$, illustrated in FIG. 17A, for example. The register 67 operates as the write register RegDW as shown in FIG. 20 as well as the read register RegDR shown in FIG. 17A.

The read data obtained from the memory core is supplied, through an internal data bus 105, to the acquisition gate 60 and the data output circuit 103 of the data input/output unit $101_1$-$101_n$. The data output circuit 103 sends, through the data bus 16D, a data inversion pulse signal (a LOW pulse, for example) corresponding to "1" of the result of an Exclusive-Or operation. Write data is supplied, through the data bus 16D, to the data input circuit 102, and if the input circuit detects an LOW pulse indicating a data inversion, a pulse is supplied to the register 67. The register 67 outputs a write data or comparison data through the internal data bus 104. The comparison data is previous read data that was obtained before current read data, and was stored in the register 67 through the acquisition gate 60.

Figure 21:
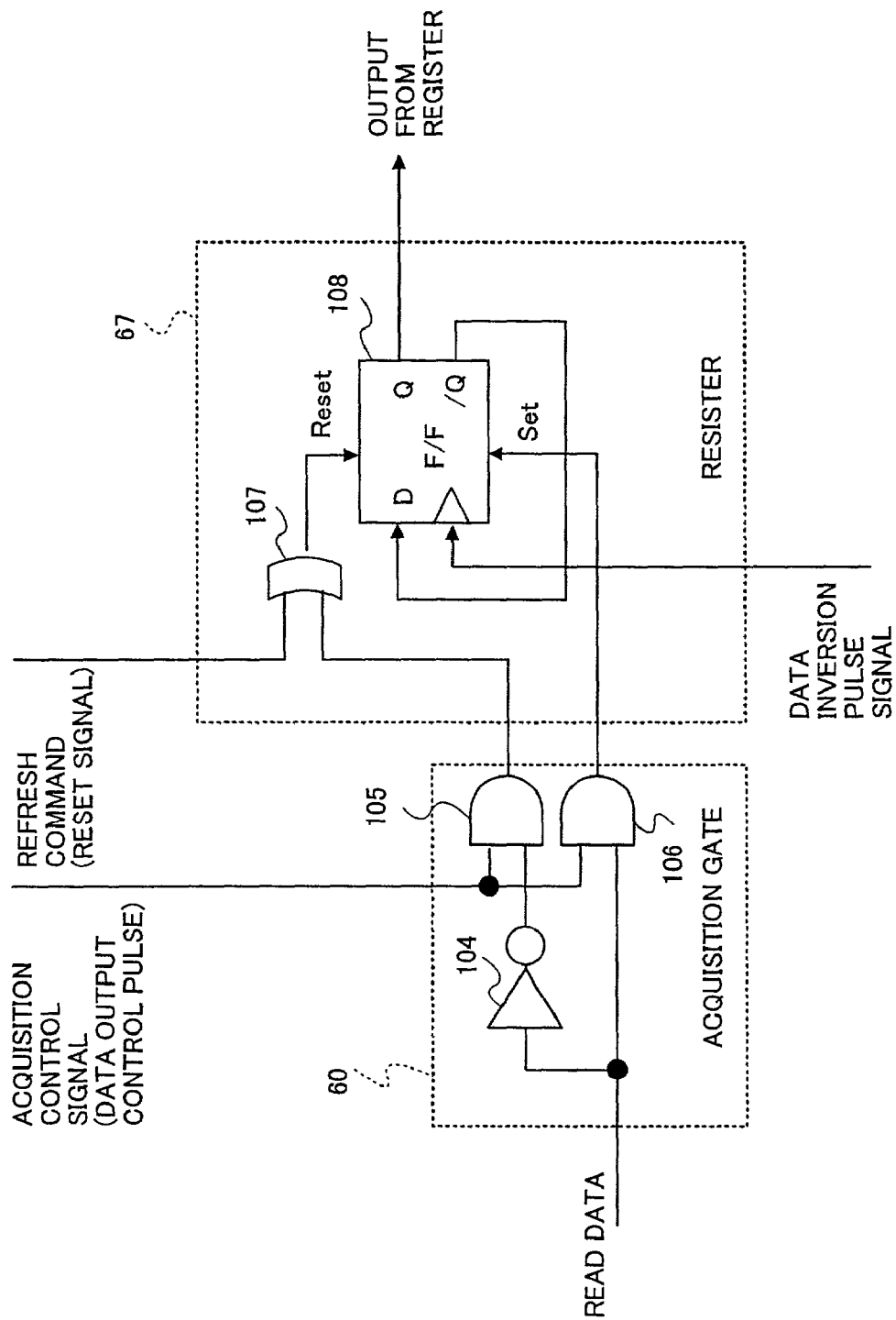
FIG. 21 is a circuit diagram of an example of a register and an acquisition gate shown in FIG. 20.

FIG. 21 is a circuit diagram showing an embodiment of the acquisition gate 60 and the register 67 shown in FIG. 20. FIG. 21 shows a portion of the circuit corresponding to "1" bit. The acquisition gate 60 includes an inverter 104 and two AND gates 105 and 106. Read data is transferred through the internal data bus 105, and is input directly to an AND gate 106. The read data is also input, after being inverted by the inverter 104, to another AND gate 105. The AND gate 105 and 106 receive a data output control pulse which controls the data acquisition.

The register 67 includes an OR gate 107 and a set terminal flip-flop 108. The output of the AND gate 105 is supplied to the reset terminal of the flip-flop 108 through the OR gate 107. A refresh command (or reset signal) is supplied to this reset terminal through the OR gate 107. The output of the AND gate 106 is connected to set terminal of the flip-flop. A data inversion pulse signal generated by the data input & pulse generation circuit 102 is supplied to the clock terminal. The "/Q" terminal is connected to the "D" terminal, and the "Q" terminal is the output of the register of 67.

The operation of the circuit shown in FIG. 21 will be explained. When a refresh command (or a reset signal) is issued to the flip-flop 108, the flip-flop 108 is reset, and consequently the "Q" terminal is set at a LOW level. During a data output, the data output control pulse turns to the HIGH level. If read data of the LOW level is supplied, the reset terminal turns to the HIGH level, and the "Q" output turns to the LOW level. When write data is acquired, the data input & pulse generation circuit 102 issues a data inversion pulse to the clock terminal of the flip-flop 108, and the "Q" output is consequently inverted.

As described above, by sharing a single register between a write and a read operation, chip area will be saved.

Figure 22:
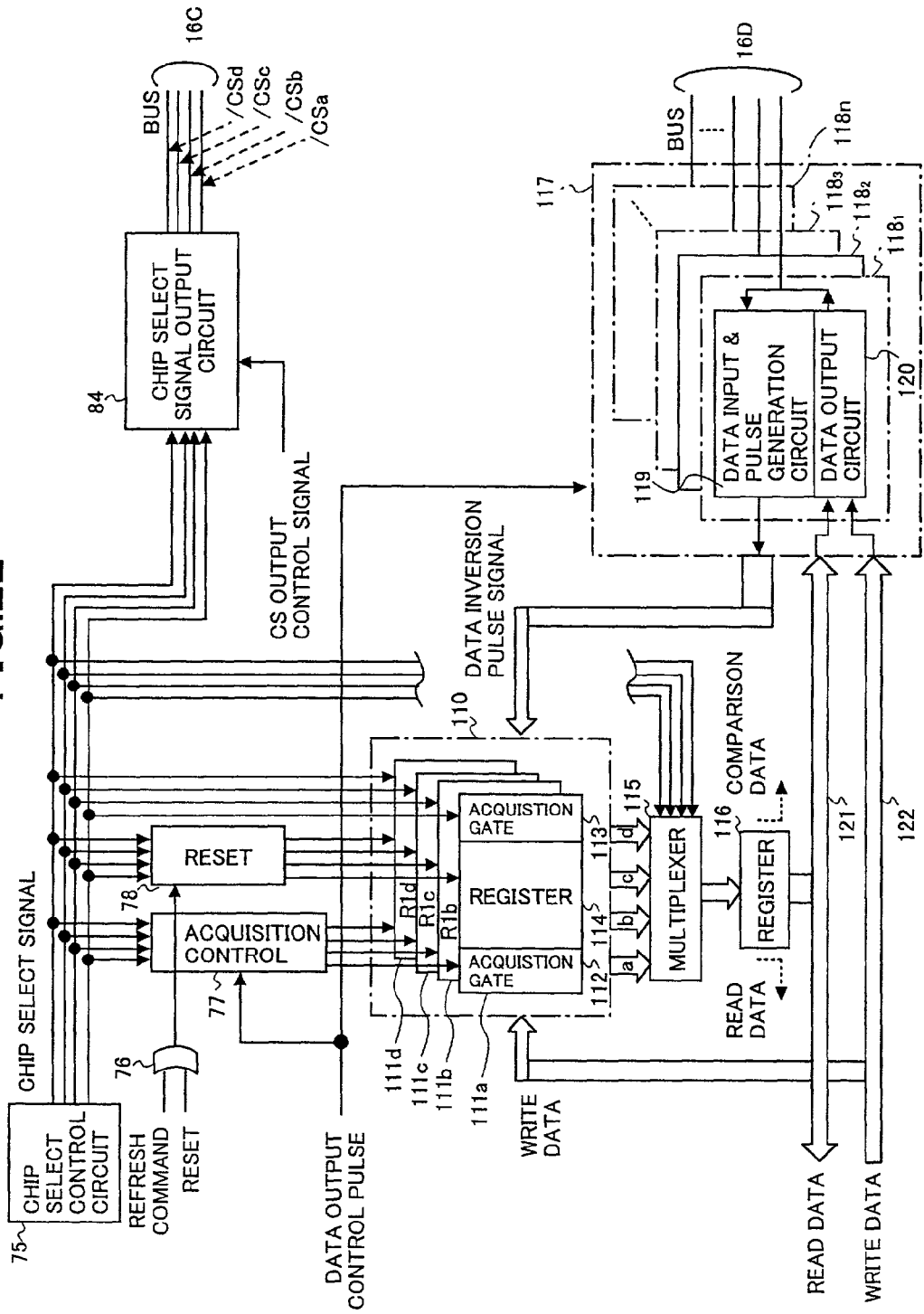
FIG. 22 is a block diagram showing a second embodiment of a "/CS" output unit and a data output unit provided in a controller.

Another Embodiment of Data Input Unit of "/CS" Output Unit and Data Output Unit of Controller Another embodiment, a second embodiment, of a chip select signal output unit (hereinafter referred to as "/CS" output unit) and a data output unit provided in the controller 10 will be described with reference to FIG. 22. This embodiment operates as both a read data register RegDW-C and a write data register RegDR-C. Common components to both FIG. 22 and FIG. 18 are referred to by the same numerals.

A group of registers 110 includes 4 register units 111a-111d corresponding to 4 memories 13a-13d shown in FIG. 2. Each register unit 111a-111d includes two acquisition gates 112 and 113, and a register 114. An acquisition control circuit 77 activates one of the acquisition gates 112 in response to a chip select signal. The acquisition gate 113 of the register units 111a-111d is controlled in response to a corresponding chip select signal. Write data transferred through an internal write data bus 122 is stored in the registers 114 through one of the acquisition gates 111a-111d. A data inversion pulse signal from a data input/output unit 117, which will be described in detail later, is stored in the register 114 through one of the register units 111a-111d. A multiplexer 115, in response to the chip select signal, selects one of the register units 111a-111d, and stores retrieved data in a register 116. Retrieved data from the register 116 is transferred through an internal data bus 121.

The data input/output unit 117 has substantially the same structure as the data input/output unit 100 shown in FIG. 20. The data input/output unit 117 includes "n" data input/output units $118_1$-$118_n$. Each data input/output unit includes a data input & pulse generation circuit 119 and a data output circuit 120. The data input circuit 119 corresponds to the input circuits $92_1$-$92_n$ shown in FIG. 19, and includes all the circuitry up to the pulse generation units 31, excluding the write registers RegDW, of the data input circuits of the first through sixth embodiments previously described. The write register RegDW corresponds to the register 114. The data output circuit 120 corresponds to the data output circuits $87_1$-$87_n$, for example. A chip select signal output circuit 84 includes the chip select signal output circuits 84a-84d shown in FIG. 18.

Figure 23:
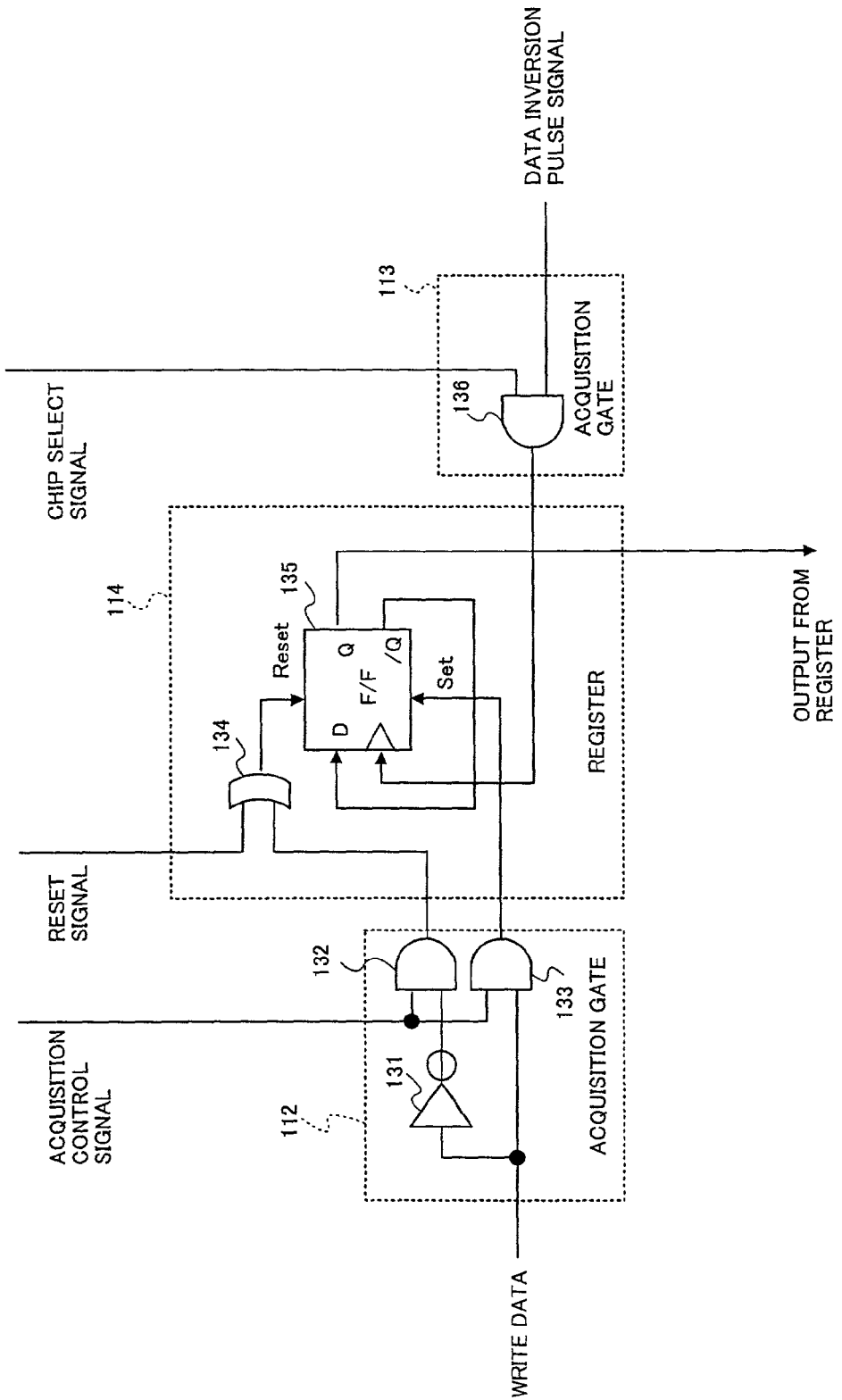
FIG. 23 is a circuit diagram showing an example of the register and the acquisition gate shown in FIG. 22.

FIG. 23 is a circuit diagram showing an example of circuit configuration of the acquisition register gates 112 and 113, and the register 114. The acquisition gate 112 includes an inverter 131 and 2 AND gates 132 and 133. The acquisition gate 113 includes an AND gate 136. The register 114 includes an OR gate 134 and a flip-flop 135. The circuit configuration of the acquisition gate 112 is identical to that of the register 67 shown in FIG. 21. Both configurations differ in that, in the circuit configuration shown in FIG. 21, a data inversion pulse signal is supplied directly to the clock pin of the flip-flop 108, and in the circuit configuration shown in FIG. 23, however, the data inversion pulse signal is supplied to the clock pin of the flip-flop 135 through the acquisition gate 113 including the AND gate 136. The AND gate 136 obtain an output of an AND operation between the data inversion pulse signal and the corresponding chip select signal. When the chip select signal is ON, the data inversion pulse signal generated by the data input & pulse generation circuit 119 is supplied to the clock pin of the flip-flop 135 through the AND gate 136. A "Q" output is temporarily stored in the register 116 through the multiplexer 115, and then supplied to the memory cores as read data.

Second Principle of Present Invention

Figure 24A:
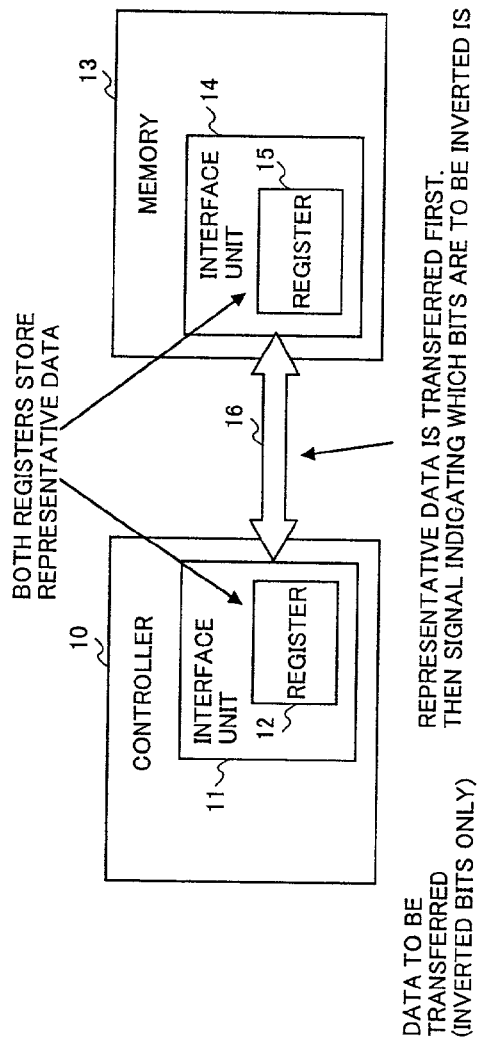
FIG. 24A is a block diagram showing a second principle of the present invention.

The second principle of the present invention will be described with reference to FIG. 24A.

In the first principle of the present invention shown in FIG. 1, both the register 12 of the controller 10 and the register 15 of the memory 13 always store last data exchanged. In the second principle of the present invention, however, common representative data is stored by both the register 12 of the controller 10 and the register 15 of the memory 13. Then, a data inversion signal representing bits which is different from the representative data is transferred. This transfer is made by a pulse, for example.

In the case that a group of data is to be transferred, for example, representative data is transferred first, and then, bits which is different from the representative data is transferred. In this case, two commands, WRITE (A) to transfer the representative data and WRITE (B) to transfer the inversion bits, are issued. In the same manner, two read commands, READ (A) to send read data as it is and READ (B) to send only the inversion bits, are used. A signal is transferred by a pulse. It is necessary to predetermine that, for example, sending a LOW pulse corresponds to "0", and sending no pulse corresponds to "1" before transferring representative data.

Figure 24B:
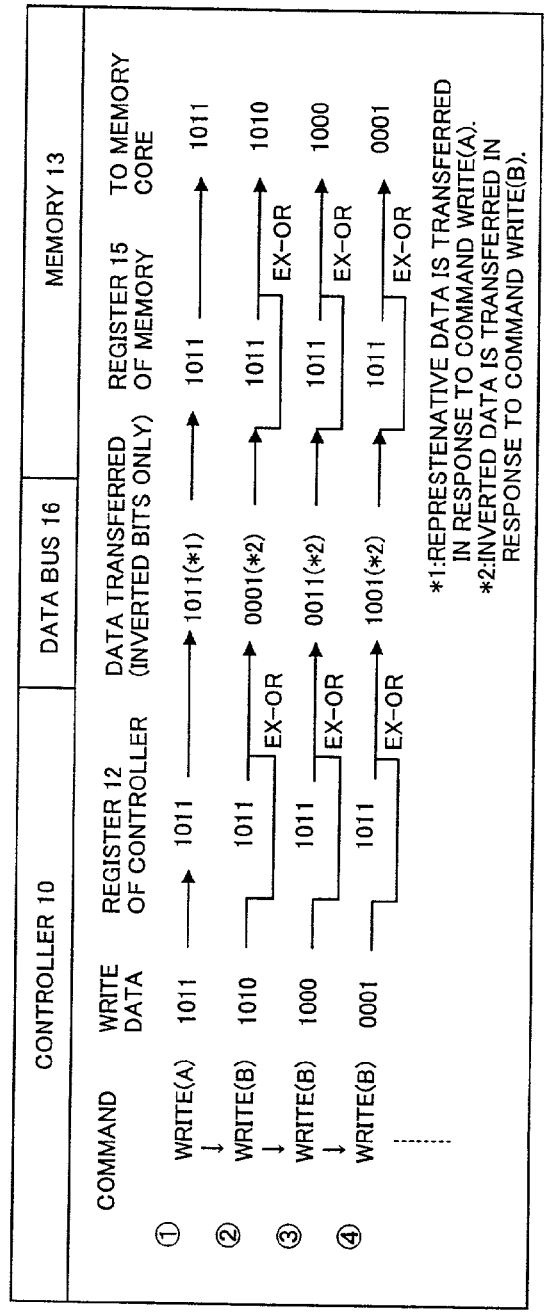
FIG. 24B is a diagram illustrating how an example data series are exchanged by the second principle of the present invention.

In step ① of the example shown in FIG. 24B, the controller 10 stores representative data 1011 in both the register 12, and at the same time, the register 15 of the memory 13 using a write command WRITE (A). The same representative data is stored in both the register 12 and 15.

In step ②, the controller 10 calculates an Exclusive-Or operation of a write data 1010 and the representative data 1011, and sends the result 0001 to the memory 13 through the data bus 16. A write command WRITE (B) is used in this step. The memory 13 calculates an Exclusive-Or operation between the receiving data 0001 and the representative data 1011, and stores the result 1010 in the memory core.

Steps ③ and ④ follow in the same manner.

Figure 25:
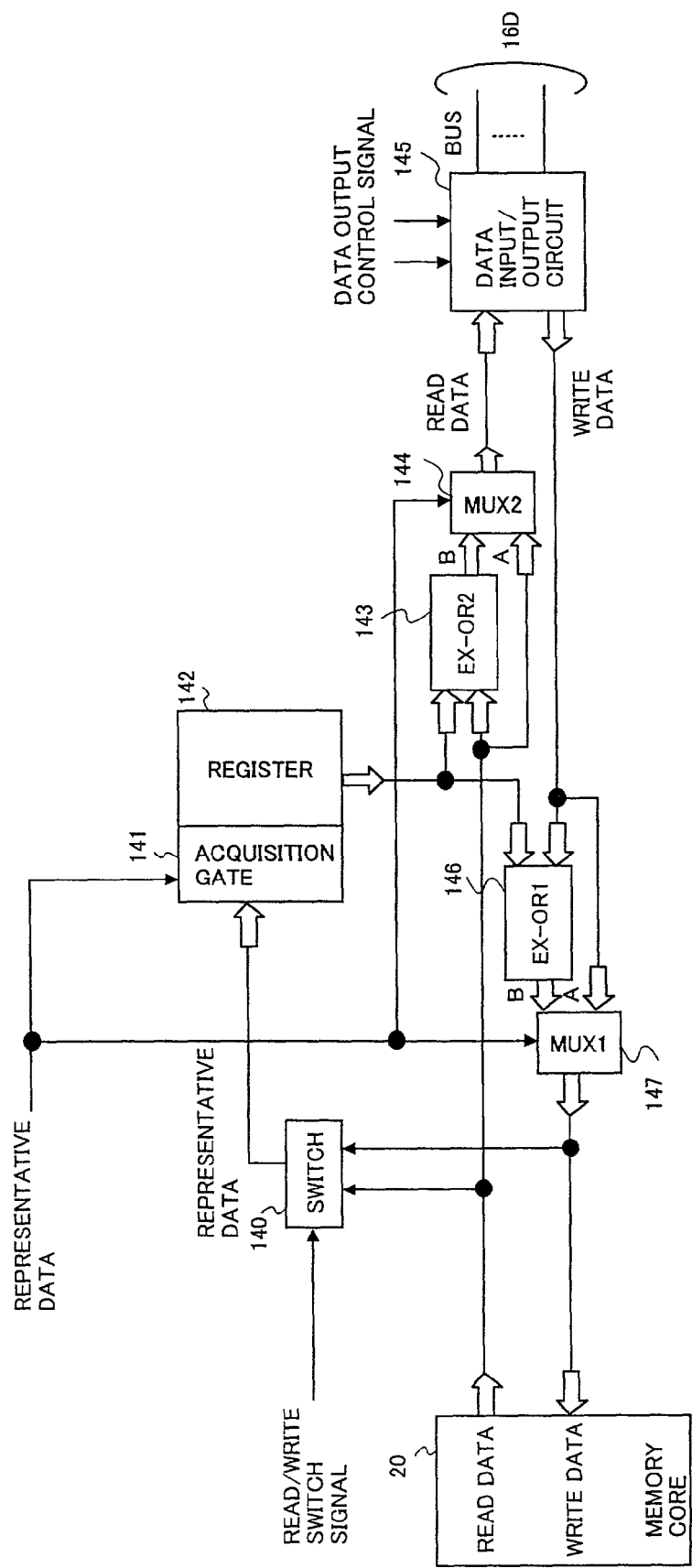
FIG. 25 is a block diagram of an embodiment of a data input/output unit of a memory corresponding to the second principle of the present invention.

Preferred Embodiment of Data Input/Output Unit of Memory Corresponding to Second Principle FIG. 25 shows a preferred embodiment of the data input/output unit of the memory (corresponding to the memory 13 and/or the memories 13a-13d shown in FIG. 2) corresponding to the second principle. A write register and a read register share a register in this example.

The data input/output unit shown in FIG. 25 includes a memory core 20, a switch 140, an acquisition gate 141, a register 142, an Exclusive-Or gate 143 (shown as EX-OR2), a multiplexer 144 (MUX2), a data input/output circuit 145, an Exclusive-Or gate 146 (EX-OR1), and a multiplexer 147.

When representative data is to be transferred, a representative data acquisition signal is issued inside of the memory, activates an acquisition gate 141, and selects inputs A of the multiplexers 144 and 147. The switch 140 switches in response to write or read. In case of write, write data is acquired from the data input/output circuit 145, and sent to the memory core 20 through the multiplexer 147 without any data manipulation. The write data is also stored in the register 142. In case of read, in contrast, data retrieved from the memory core 20 is sent, as it is, to both the data input/output circuit 145 as an output, and the register 142 for storage.

When an inversion bit is to be transferred, the two multiplexers 144 and 147 select an input B. In case of write data, the data input/output circuit 145 acquires the write data, and the Exclusive-Or gate 146 calculates an Exclusive-Or of the write data and the representative data stored in the register 142. The result is sent to the memory core 20 through the multiplexer 147. In case of read data, the Exclusive-Or gate 143 calculates an Exclusive-Or of retrieved data from the memory core 20 and the representative data stored in the register 142. The result is sent out through the multiplexer 144 and the data input/output circuit 145.

Generally, the representative data is transferred from the controller 10 to the memories 13a-13d. FIG. 25, however, illustrates a circuit configuration which is capable to transfer the representative data from the memories 13a-13d to the controller 10.

Figure 26:
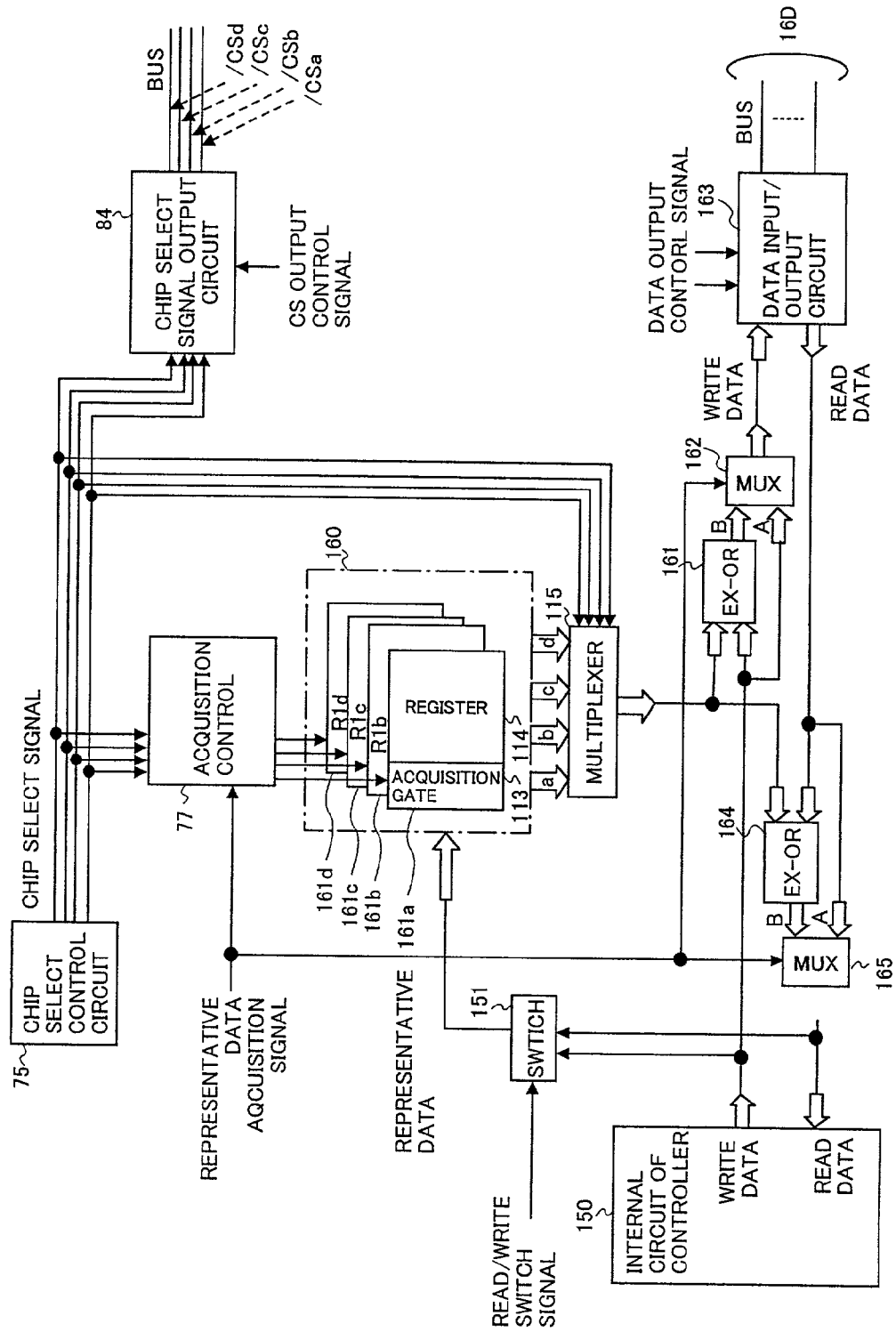
FIG. 26 is a block diagram of another embodiment of a data input/output unit of a memory corresponding to the second principle of the present invention.

Preferred Embodiment of Data Input/Output Unit of Controller Corresponding to Second Principle FIG. 26 shows a preferred embodiment of a data input/output unit of the controller corresponding to the second principle, where a register is shared by both a write operation and a read operation. Common components shown in the previous figures are referred to by the same numerals.

The data input/output unit shown in the figure includes a chip select circuit 75, a acquisition control circuit 77, a chip select signal output circuit 84, a multiplexer 115, an internal circuit 150 of the controller 150, a switch 151, and a group of registers 160. Furthermore, the data input/output unit includes an Exclusive-Or gate 161 (EX-OR), a multiplexer 162 (MUX), a data input/output circuit 163, an Exclusive-Or gate 164 (EX-OR), and a multiplexer 165 (MUX).

The group of the registers 160 is provided with 4 register units 161a-161d corresponding to the 4 memories 13a-13d. Each register unit 161a-161d includes an acquisition gate 113 and a register 114.

When a representative data is to be transferred, the internal circuit 150 issues a representative data acquisition signal. One of the register units 161a-161d is selected in response to a chip select signal, and the acquisition gate 113 of the selected register unit is activated by the acquisition gate 77. The representative data acquisition signal also activates an input A of the multiplexer 162 and 165. The switch 151 switches in accordance with write or read. In case of write data, the write data is acquired from the data input/output circuit 163, and sent to the internal circuit 150 through the multiplexer 165. The write data is also stored in the register 114 of a corresponding register unit. In case of read data, in contrast, the read data retrieved from the internal circuit 150 is sent through the multiplexer 162 and the data input/output circuit 163. The read data is also stored in the register 114 of the corresponding register.

When an inversion bit is to be transferred, an input B of two multiplexers 162 and 165 is selected. In case of write data, the data input/output circuit 163 acquires the write data, and the Exclusive-Or gate 164 calculates an Exclusive-Or of the acquired write data and the representative data stored in the register 114. The result is sent to the internal circuit 150 through the multiplexer. In case of read data, the Exclusive-Or gate 161 calculates an Exclusive-Or of the read data retrieved from the internal circuit 150 and the representative data stored in the register 114. The result is sent through the multiplexer 162 and the data input/output circuit 163.

In the case that data stored in the registers 142 and 160 of the circuit configurations shown in FIG. 25 and 26, is accidentally inverted due to a power supply noise, for example, the data damage can be fixed by sending representing data from the controller 10 to the memories. It may be recommendable to reserve a command, in a command set, dedicated to representative data renewal (a representative data renewal command) without a write operation or a read operation.

Preferred Embodiment of Data Input/Output Unit of Memory Corresponding to Both First and Second Principles FIG. 27 illustrates the preferred embodiment of the data input/output unit of the memory corresponding to both the first principle and the second principle of the present invention. Common components to both FIG. 27 and 25 are referred to by the same numerals. This memory operates in a mode (Mode 1) corresponding to the first principle, and in another mode (Mode 2) corresponding to the second principle.

An acquisition gate 141 is controlled in response to a result of logical operations of a gate control 1 signal, a mode switch signal, and a representative data acquisition signal. The logical operations is executed by an inverter 167, an AND gate 168, 169, and an OR gate 170. A register 142 is reset in response to a signal obtained by logical operations of a reset signal (or refresh signal) and a mode switch signal using the inverter 171 and the AND gate 172. A gate 173 and a latch 174 are included between a multiplexer 147 and a memory core 20. The gate 173 is controlled based on the result of an OR operation by an OR gate 165 of the mode switch signal and a gate 2 signal. A gate 175 and a latch 176 are included between a multiplexer 144 and a data input/output circuit 145. The gate 175 is controlled by the result of an OR operation by an OR gate 166 of the mode switch signal and a gate 3 signal. These gate 173, latch 174, gate 175, and latch 176 together enable the memory device to operate in Mode 1.

The gate control 1 signal, the gate control 2 signal, the gate control 3 signal, the data input/output control signal, the representative data acquisition signal, and the read/write switch control signal are generated by an internal circuit (not shown) of a timing controller of the memory, for example. The mode select signal may be set from the exterior of the device using a mode register, or may be programmed as factory default data using fuses, for example. Furthermore, if commands respectively corresponding to Mode 1 and Mode 2 are provided, the controller can switch the mode by issuing a command.

In Mode 1, the mode select signal is set at the LOW level. The multiplexers 144 and 147 select an input B. The register 142 is reset in response to a refresh command. The timing of the gate control 1 signal and the gate control 2 signal during a write operation in Mode 1 is show in FIG. 27. The write data is latched in the latch 174 by activating the gate 173 when the gate control 2 signal is turned ON, and then stored in the register 142 by activating the acquisition gate 141 when the gate control 1 signal is turned ON. In case of a read operation, the read data is first latched in the latch 176 by turning the gate control 3 signal on, and then stored in the register 142 by activating the acquisition gate 141 in response to the gate control 1 signal turned on. The acquisition gate 141, the gate 173, and the gate 175 are controlled, respectively, by the gate control 1 signal, the gate control 2 signal, and the gate control 3 signal of which timing is related to each other as described above. The operation of the Mode 1 is essentially the same as the operation of the circuit configuration previously described with reference to FIG. 20.

In Mode 2, the mode switch signal is set at the HIGH level. The acquisition gate 1 and the multiplexer 144 and 147 are controlled in response to the representative data acquisition signal. The gate 173 and 175 are always set open. The refresh command does not reset the register 142. The Mode 2 operates in the same manner as the circuit configuration shown in FIG. 25.

In the case that data stored in the register 142 is inverted by accident due to a power supply noise, for example, such damage in data can be corrected by, in Mode 1, resetting the register 142 and by, in Mode 2, transferring the representative data for renewal of the representative data stored in the register 142.

In the circuit configuration shown in FIG. 27, the following countermeasure against the accidental damage in data can be taken if a register-renewal command similar to the representative data renewal command in Mode 1 previously described is provided in a command set. When the data stored in the register 142 is to be renewed during Mode 1, the controller 10 issues the register renewal command, and sends the latest data, as it is, stored in the register to the memory. The memory, when receiving the register-renewal command, temporarily holds the mode switch signal at the HIGH level, and issues a representative data acquisition signal. The registers of the controller and the memory automatically share the same data in this procedure. After storing the same data in the registers of the controller and the memory, the operation of the memory goes back to the Mode 1 by setting the mode switch signal and the representative data acquisition signal at the LOW level. In other words, the registers of the controller and the memory have the same data by transferring the data stored in the registers of the controller to the memory 142 without data manipulation, instead of resetting the registers.

The data input/output unit of the controller corresponding to both the first principle and the second principle differs from the data input/output unit of the memory shown in FIG. 27 in that plural acquisition gates 141 and plural registers 142 sufficient to serve corresponding memories are required, and selectors between the switch 140 and the acquisition gate 141, and between the OR gate 170 and the acquisition gate 141, and between the OR gate 172 and the register 142 are also required.

The preferred embodiments of the present invention are described above. The present invention is not limited to these embodiments, but various variations and modifications may be made without departing from the scope of the present invention.

This patent application is based on Japanese priority patent application No. 2001-067616 filed on Mar. 9, 2001, the entire contents of which are hereby incorporated by reference.

What is claimed is:

1. A semiconductor device, exchanging a data series with an exterior of the device, comprising:
 a register which stores a first data item of said data series, the first data item immediately preceding a second data item of said data series; and
 an exchange circuit which exchanges with the exterior of the device a signal indicative of which bit or bits of the first data item are to be inverted to convert the first data item into the second data item, the exchanging of the signal effectively achieving the exchanging of the data series.

2. The semiconductor device as claimed in claim 1, wherein said exchange circuit generates the second data item in response to the signal received from an exterior of the device, and sends the second data item to an internal circuit of the device.

3. The semiconductor device as claimed in claim 1, wherein said exchange circuit generates the signal in response to the second data item received from an internal circuit of the device, and sends the signal to an exterior of the device.

4. The semiconductor device as claimed in claim 1, wherein said exchange circuit replaces said first data item stored in said register with said second data item.

5. The semiconductor device as claimed in claim 2, wherein said exchange circuit stores said first data item in said register when the first data item is received, and generates said second data item when said signal is received.

6. The semiconductor device as claimed in claim 3, wherein said exchange circuit stores said first data item in said register when said first data item is received, and generates said signal when said second data item is received.

7. The semiconductor device as claimed in claim 1, wherein said register is reset in response to a reset signal.

8. The semiconductor device as claimed in claim 1, wherein said semiconductor device further comprises a memory array, and said register is reset in response to a refresh command received from an exterior of the device.

9. The semiconductor device as claimed in claim 1, wherein said signal is a pulse.

10. The semiconductor device as claimed in claim 2, wherein said exchange circuit includes a data input unit which latches said signal, and said semiconductor device further comprises a circuit which receives a chip select signal from an exterior of the device, and said data input unit latches said signal in response to said chip select signal.

11. The semiconductor device as claimed in claim 10, wherein said signal is a pulse, and said data input unit latches said signal in response to an edge of the pulse.

12. The semiconductor device as claimed in claim 1, wherein said exchange circuit includes a data input unit which latches said signal, and said semiconductor device further comprises a clock generation unit which generates an internal clock in response to a clock received from an exterior of the device, and said data input unit latches said signal in synchronism with the internal clock.

13. The semiconductor device as claimed in claim 1, wherein said exchange circuit includes a data input unit which latches said signal, and said semiconductor device further comprises a clock generation unit which generates an internal clock in response to a clock input from an exterior of the device, and said data input unit latches said signal, which is a pulse, in response to an pulse edge of said signal during a predetermined period defined relative to said internal clock.

14. The semiconductor device as claimed in claim 3, wherein said semiconductor device is a controller which controls a semiconductor memory device, and resets said register in relation to a refresh command when issuing the refresh command to said semiconductor memory device.

15. The semiconductor device as claimed in claim 1, wherein said semiconductor device further comprises an interface which selectively provides a connection with a plurality of semiconductor devices, and said register is provided for each of said plurality of semiconductor devices.

16. The semiconductor device as claimed in claim 2, wherein said exchange circuit generates said second data item by performing an Exclusive-Or operation of said first data item and said signal.

17. The semiconductor device as claimed in claim 3, wherein said exchange circuit generates said signal by performing an Exclusive-Or operation of said first data item and said second data item.

18. A system comprises the semiconductor devices claimed in claim 1, wherein registers of said semiconductor devices store a common first information.

19. A method for exchanging a data series with an exterior of the device, comprising:

a step of storing a first data item of said data series, the first data item immediately preceding a second data item of said data series; and a step of exchanging with the exterior of the device a signal indicative of which bit or bits of the first data item are to be inverted to convert the first data item into the second data item, the exchanging of the signal effectively achieving the exchanging of the data series.

20. The method as claimed in claim 19, wherein said second data item is generated by performing a logical operation between a signal received from an exterior of the device and said first data item in said register.

21. The method as claimed in claim 19, wherein said signal is generated by performing a logical operation between a second data item received from an exterior of the device and said first data item in said register.

22. The method of information processing as claimed in claim 18, wherein the method further comprises a step of replacing said first information stored in said register with said second information.

* * * * *